(12) United States Patent
Wu et al.

(10) Patent No.: US 11,171,090 B2
(45) Date of Patent: Nov. 9, 2021

(54) SEMICONDUCTOR DEVICE AND METHOD OF MANUFACTURE

(71) Applicant: Taiwan Semiconductor Manufacturing Company, Ltd., Hsinchu (TW)

(72) Inventors: Jiun Yi Wu, Zhongli (TW); Ching-Hua Hsieh, Hsinchu (TW); Chen-Hua Yu, Hsinchu (TW); Chung-Shi Liu, Hsinchu (TW); Shou-Yi Wang, Hsinchu (TW); Chien-Hsun Chen, Zhutian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 33 days.

(21) Appl. No.: 16/411,639

(22) Filed: May 14, 2019

(65) Prior Publication Data

US 2020/0075488 A1 Mar. 5, 2020

Related U.S. Application Data

(60) Provisional application No. 62/725,161, filed on Aug. 30, 2018.

(51) Int. Cl.
*H01L 23/52* (2006.01)
*H01L 23/528* (2006.01)
(Continued)

(52) U.S. Cl.
CPC ........ *H01L 23/5283* (2013.01); *H01L 21/561* (2013.01); *H01L 21/563* (2013.01);
(Continued)

(58) Field of Classification Search
None
See application file for complete search history.

(56) References Cited

U.S. PATENT DOCUMENTS

| 8,993,380 B2 | 3/2015 | Hou et al. |
| 9,000,584 B2 | 4/2015 | Lin et al. |

(Continued)

FOREIGN PATENT DOCUMENTS

| CN | 103681362 A | 3/2014 |
| CN | 104733379 A | 6/2015 |

(Continued)

*Primary Examiner* — Moin M Rahman
(74) *Attorney, Agent, or Firm* — Slater Matsil, LLP

(57) ABSTRACT

A method includes forming a device structure, the method including forming a first redistribution structure over and electrically connected to a semiconductor device, forming a molding material surrounding the first redistribution structure and the semiconductor device, forming a second redistribution structure over the molding material and the first redistribution structure, the second redistribution structure electrically connected to the first redistribution structure, attaching an interconnect structure to the second redistribution structure, the interconnect structure including a core substrate, the interconnect structure electrically connected to the second redistribution structure, forming an underfill material on sidewalls of the interconnect structure and between the second redistribution structure and the interconnect structure.

20 Claims, 22 Drawing Sheets

(51) Int. Cl.
- *H01L 23/00* (2006.01)
- *H01L 21/56* (2006.01)
- *H01L 23/48* (2006.01)
- *H01L 21/78* (2006.01)
- *H01L 23/532* (2006.01)
- *H01L 21/60* (2006.01)

(52) U.S. Cl.
CPC ............ *H01L 21/565* (2013.01); *H01L 21/78* (2013.01); *H01L 23/481* (2013.01); *H01L 23/53295* (2013.01); *H01L 24/17* (2013.01); *H01L 24/96* (2013.01); *H01L 2021/6015* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,966,321 B2 | 5/2018 | Lu et al. | |
| 2013/0049234 A1* | 2/2013 | Lin | H01L 23/49816 257/787 |
| 2014/0077361 A1 | 3/2014 | Lin et al. | |
| 2015/0069623 A1* | 3/2015 | Tsai | H01L 25/117 257/774 |
| 2015/0179570 A1 | 6/2015 | Marimuthu et al. | |
| 2015/0206865 A1* | 7/2015 | Yu | H01L 24/17 257/737 |
| 2015/0262972 A1 | 9/2015 | Katkar et al. | |
| 2015/0318261 A1 | 11/2015 | Chung et al. | |
| 2017/0141080 A1 | 5/2017 | Chen et al. | |
| 2017/0338204 A1 | 11/2017 | Lee et al. | |
| 2019/0006339 A1* | 1/2019 | Lau | H01L 25/105 |

FOREIGN PATENT DOCUMENTS

| | | |
|---|---|---|
| CN | 107068645 A | 8/2017 |
| CN | 107749411 A | 3/2018 |
| KR | 20150039134 A | 3/2015 |
| TW | 201603235 A | 1/2016 |
| TW | 201724460 A | 7/2017 |
| TW | 201810575 A | 3/2018 |

\* cited by examiner

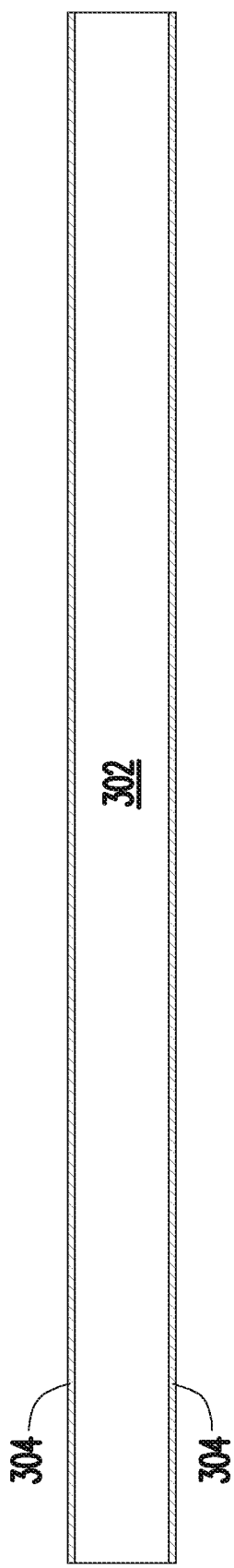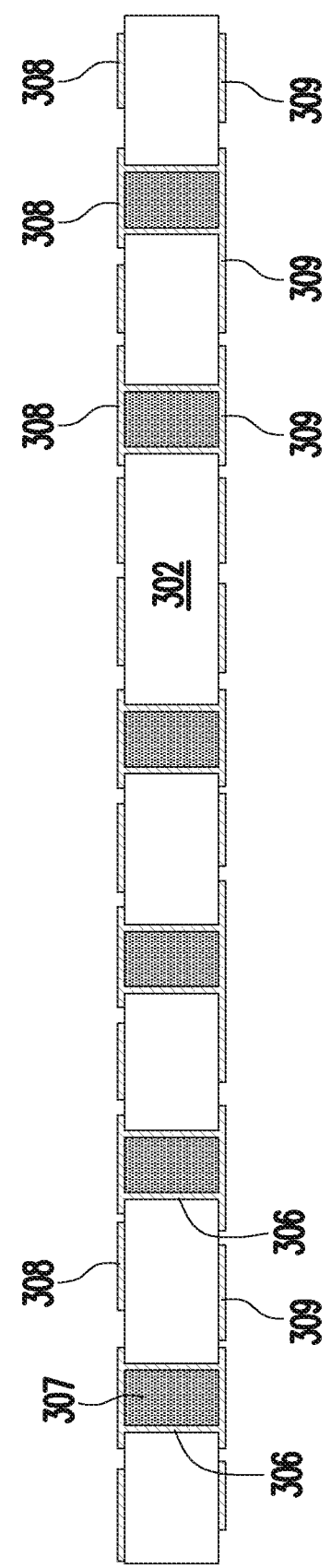
FIG. 9A
FIG. 9B

SEMICONDUCTOR DEVICE AND METHOD OF MANUFACTURE

PRIORITY CLAIM AND CROSS-REFERENCE

This application claims priority to and the benefit of U.S. Provisional Application No. 62/725,161, filed on Aug. 30, 2018, which application is hereby incorporated herein by reference in its entirety.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A through 9C illustrate cross-sectional views of intermediate steps of forming an interconnect structure, in accordance with some embodiments.

DETAILED DESCRIPTION

Figure 1:
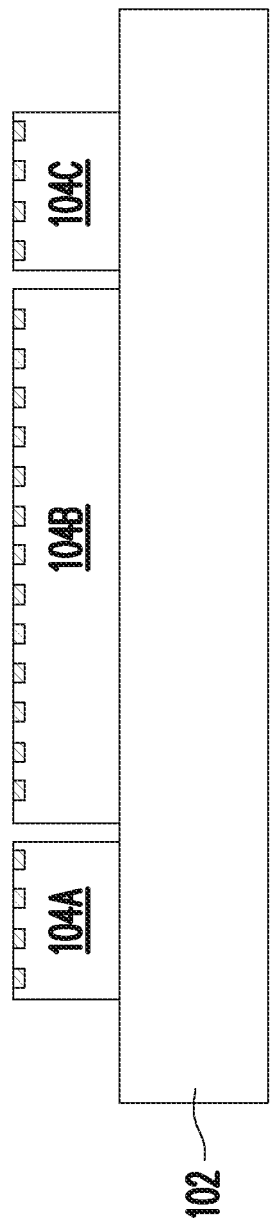
FIGS. 1 through 4 illustrate cross-sectional views of intermediate steps of forming a device structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a system-in-package. In some embodiments, a first redistribution structure may be formed over the one or more semiconductor devices, and then a second redistribution structure formed over the first redistribution structure. The redistribution structures may be, for example, fan-out structures. An interconnect structure is formed on a core substrate and then attached to the second redistribution structure. By forming more of the routing within the redistribution structures rather than within the interconnect structure, the electrical performance of the device package may be improved and the overall manufacturing cost of the device package may be reduced. The interconnect structure can also provide rigidity to the device package and reduce the chance change of warping or delamination.

FIGS. 1 through 15 illustrate cross-sectional views of intermediate steps of forming a package 400 (see FIG. 15), in accordance with some embodiments. FIGS. 1 through 4 illustrate cross-sectional views of intermediate steps of forming a device structure 100 (see FIG. 4), in accordance with some embodiments. FIGS. 5 through 8 illustrate cross-sectional views of intermediate steps of forming a device structure 200 (see FIG. 8) incorporating, e.g., the device structure 100, in accordance with some embodiments. FIGS. 9A through 9C illustrate cross-sectional views of intermediate steps of forming interconnect structure 300, in accordance with some embodiments. FIGS. 10-15 illustrate cross-sectional views of intermediate steps of forming a package 400, in accordance with some embodiments.

With reference now to FIG. 1, there is shown a carrier substrate 102 on which one or more semiconductor devices, such as semiconductor devices 104A, 104B, and 104C, have been placed, in accordance with some embodiments. The carrier substrate 102 may include, for example, silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material, a plastic material, or an organic material. The panel structure may be, for example, a rectangular panel. The carrier substrate 102 may be planar in order to accommodate an attachment of devices such as the semiconductor devices 104A-C.

In some embodiments, a release layer (not shown) may be formed on the top surface of the carrier substrate 102 to facilitate subsequent debonding of the carrier substrate 102. The release layer may be formed of a polymer-based material, which may be removed along with the carrier substrate 102 from the overlying structures that will be formed in subsequent steps. In some embodiments, the release layer is an epoxy-based thermal-release material, which loses its adhesive property when heated, such as a Light-to-Heat-Conversion (LTHC) release coating. In other embodiments, the release layer may be an ultra-violet (UV) glue, which loses its adhesive property when exposed to UV light. The release layer may be dispensed as a liquid and cured, may be a laminate film laminated onto the carrier substrate 102, or the like. The top surface of the release layer may be leveled and may have a high degree of co-planarity.

The semiconductor devices 104A-C are placed on the carrier substrate 102 using a suitable process such as a pick-and-place process. Each of the semiconductor devices 104A-C shown in FIG. 1 may be a semiconductor device designed for an intended purpose such as a memory die (e.g., a DRAM die, a stacked memory die, a high-bandwidth memory (HBM) die, etc.), a logic die, a central processing unit (CPU) die, a system-on-a-chip (SoC), the like, or a combination thereof. In an embodiment, the semiconductor devices 104A-C includes integrated circuit devices, such as transistors, capacitors, inductors, resistors, metallization layers, external connectors, and the like, therein, as desired for a particular functionality. In some embodiments, the semiconductor devices 104A-C may include more than one of the same type of device, or different devices. FIG. 1 shows three semiconductor devices 104A-C, but in other embodiments one, two, or more than three semiconductor devices may be placed on the carrier substrate 102.

Figure 2:
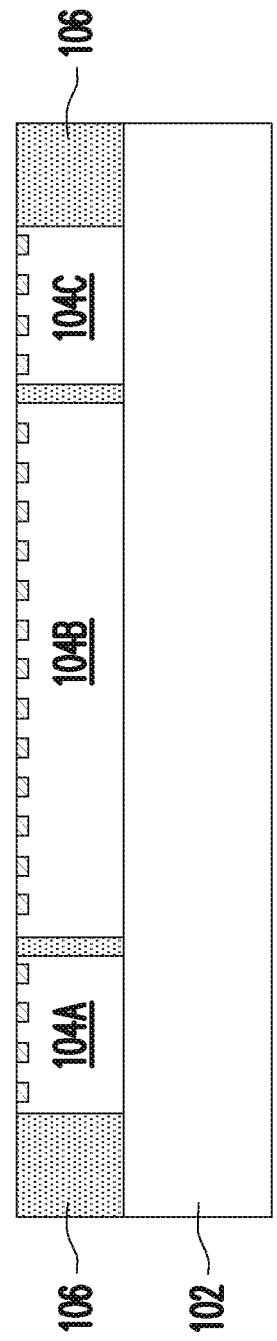

FIG. 2 illustrates an encapsulation of the semiconductor devices 104A-C. using an encapsulant 106, in accordance with some embodiments. The encapsulation may be performed in a molding device or the encapsulant 106 may be deposited using another technique. The encapsulant 106 may be a molding compound such as a resin, polyimide, PPS, PEEK, PES, another material, the like, or a combination thereof. FIG. 2 also illustrates a thinning of the encapsulant 106 in order to expose the semiconductor devices 104A-C. The thinning may expose contacts of the semiconductor devices 104A-C. The thinning may be performed, e.g., using a mechanical grinding or chemical mechanical polishing (CMP). As such, the semiconductor devices 104A-C may have planar surfaces that are also planar with the encapsulant 106. After thinning, the semiconductor devices 104A-C may have a thickness between about 25 µm and about 787 µm.

Figure 3:
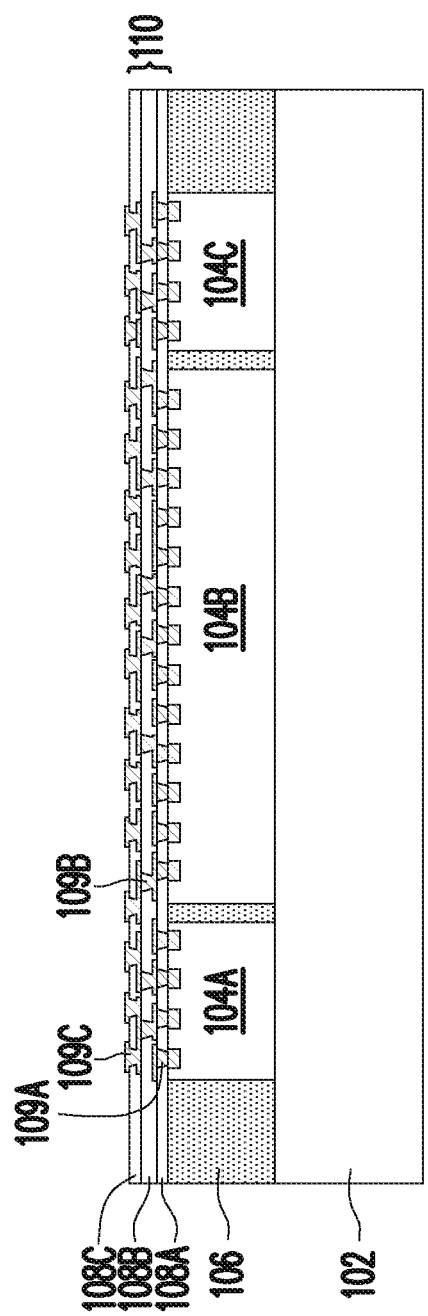

Turning to FIG. 3, a first redistribution structure 110 is formed over the semiconductor devices 104A-C and the encapsulant 106, in accordance with some embodiments. The first redistribution structure 110 shown includes insulating layers 108A, 108B and 108C and includes redistribution layers 109A, 109B, and 109C. In other embodiments, different numbers of insulating layers or redistribution layers may be formed in the first redistribution structure 110 than described herein. In some embodiments, the first redistribution structure 110 may be formed in a different process than that described herein. In some embodiments, the first redistribution structure 110 may be, for example, a fan-out structure. In other embodiments, the first redistribution structure 110 is omitted.

Still referring to FIG. 3, the insulating layer 108A is formed over the semiconductor devices 104A-C and the encapsulant 106. The insulating layer 108A may be made of one or more suitable dielectric materials such as an oxide (e.g., silicon oxide), a nitride (e.g., silicon nitride), a polymer material (e.g., a photosensitive polymer material), a polyimide material, a low-k dielectric material, another dielectric material, the like, or a combination thereof. The insulating layer 108A may be formed by a process such as spin-coating, lamination, CVD, the like, or a combination thereof. The insulating layer 108A may have a thickness of between about 1 µm and about 15 µm, such as about 5 µm, although any suitable thickness may be used. Openings into the insulating layer 108A may be formed using a suitable photolithographic mask and etching process. For example, a photoresist may be formed and patterned over the insulating layer 108A, and one or more etching processes (e.g., a wet etching process or a dry etching process) are utilized to remove portions of the insulating layer 108A. In some embodiments, the insulating layer 108A is formed of a photosensitive polymer such as PBO, polyimide, BCB, or the like, in which openings may be patterned directly using a photolithographic mask and etching process. The openings in the insulating layer 108A may expose contacts of the semiconductor devices 104A-C.

The redistribution layer 109A is then formed over the insulating layer 108A. In an embodiment, the redistribution layer 109A may be formed by initially forming a seed layer (not shown) of one or more layers of titanium, copper, or a titanium-copper alloy using a suitable formation process such as PVD, CVD, sputtering, or the like. The seed layer is formed over the insulating layer 108A and over contacts of the semiconductor devices 104A-C that are exposed by openings in the insulating layer 108A. A photoresist (also not shown) may then be formed to cover the seed layer and then be patterned to expose those portions of the seed layer that are located where the redistribution layer 109A will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating or electroless plating, or the like. However, while the material and methods discussed are suitable to form the conductive material, these are merely examples. Any other suitable materials or any other suitable processes of formation, such as CVD or PVD, may alternatively be used to form the redistribution layer 109A. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the redistribution layer 109A. In this manner, the redistribution layer 109A may form electrical connections to the semiconductor devices 104A-C.

In an embodiment, the insulating layer 108B is formed over the redistribution layer 109A and insulating layer 108A, which may be formed in a process and with materials similar to the insulating layer 108A. Alternatively, the insulating layer 108B may be formed differently than the insulating layer 108A. The insulating layer 108B may be formed to have a thickness of between about 1 µm and about 15 µm, such as about 5 µm. Openings may then be made through the insulating layer 108B by removing portions of the insulating layer 108B to expose at least a portion of the underlying redistribution layer 109A. The openings allow for contact between the redistribution layer 109A and an overlying redistribution layer 109B (described further below). The openings may be formed using a suitable photolithographic mask and etching process, such as those described above for insulating layer 108A, although any suitable process to expose portions of the redistribution layer 109A may alternatively be used. In some embodiments, the insulating layer 108B is formed of a photosensitive polymer, and openings may be patterned directly in the insulating layer 108B using a photolithographic mask and etching process.

The redistribution layer 109B may then be formed to provide additional routing along with electrical connection within the first redistribution structure 110. In an embodiment, the redistribution layer 109B may be formed using materials and processes similar to the redistribution layer 109A. For example, a seed layer may be formed, a photoresist placed and patterned on top of the seed layer in a desired pattern for the redistribution layer 109B. Conductive material may then be formed in the patterned openings of the photoresist using e.g., a plating process. The photoresist may then be removed and the seed layer etched, forming redistribution layer 109B.

The insulating layer 108C may be formed over the redistribution layer 109B and insulating layer 108B, which may be formed in a process and with materials similar to the insulating layers 108A or 108B. Alternatively, the insulating layer 108C may be formed differently than the insulating layers 108A or 108B. The insulating layer 108C may be formed to have a thickness of between about 1 µm and about 15 µm, such as about 5 µm. Openings may then be made through the insulating layer 108C by removing portions of the insulating layer 108C to expose at least a portion of the underlying redistribution layer 109B. The openings allow for contact between the redistribution layer 109B and an overlying redistribution layer 109C (described further below). The openings may be formed using a suitable photolithographic mask and etching process, such as those described above for insulating layer 108A or 108B, although any suitable process to expose portions of the redistribution layer 109B may alternatively be used. In some embodiments, the insulating layer 108C is formed of a photosensitive polymer, and openings may be patterned directly in the insulating layer 108C using a photolithographic mask and etching process.

The redistribution layer 109C may then be formed to provide additional routing along with electrical connection within the first redistribution structure 110. In an embodiment, the redistribution layer 109C may be formed using materials and processes similar to the redistribution layers 109A or 109B. For example, a seed layer may be formed, a photoresist placed and patterned on top of the seed layer in a desired pattern for the redistribution layer 109C. Conductive material may then be formed in the patterned openings of the photoresist using e.g., a plating process. The photoresist may then be removed and the seed layer etched, forming redistribution layer 109C. In some embodiments, exposed portions of the redistribution layer 109C may be contacts for subsequent electrical connections (see e.g., FIG. 7).

Figure 4:
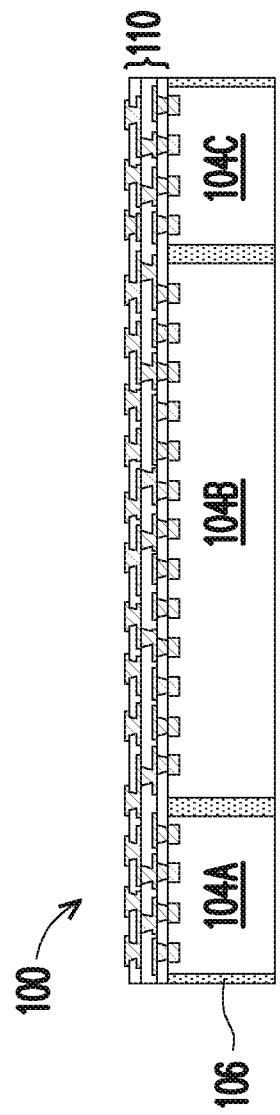

FIG. 4 illustrates a singulation and debonding to form device structure 100, in accordance with some embodiments. In an embodiment, the structure may be singulated using one or more saw blades to separate the structure into discrete pieces, forming one or more singulated device structures 100 attached to the carrier substrate 102. However, any suitable method of singulation, including laser ablation or one or more wet etches, may also be utilized. The carrier substrate 102 may be debonded from a device structure 100 using, e.g., a thermal process to alter the adhesive properties of a release layer disposed on the carrier substrate 102. In a particular embodiment an energy source such as an ultraviolet (UV) laser, a carbon dioxide ($CO_2$) laser, or an infrared (IR) laser, is utilized to irradiate and heat the release layer until the release layer loses at least some of its adhesive properties. Once performed, the carrier substrate 102 and the release layer may be physically separated and removed from a device structure 100. In some embodiments, the device structure 100 has a thickness of between about 40 µm and about 1500 µm, although any suitable thickness may be used. In some embodiments, the device structure 100 has lateral width of between about 10 mm and about 300 mm, such as about 32 mm, although any suitable width may be used.

In other embodiments, the device structure 100 is formed by first forming a redistribution structure on the carrier substrate 102. The redistribution structure may be similar to the first redistribution structure 110 described with respect to FIG. 3, and may be formed on the carrier substrate 102 in a similar manner. After forming a redistribution structure, one or more semiconductor devices are attached and electrically connected to the redistribution structure. The semiconductor devices may be similar to one or more of the semiconductor devices 104A-C described above with respect to FIG. 1. The semiconductor devices may be attached using a suitable process (e.g., a pick and place process), and may be electrically connected to the redistribution layer by e.g., direct bonding, solder balls, or another suitable technique. The semiconductor devices may then be encapsulated by an encapsulant, which may be similar to encapsulant 106 described above with respect to FIG. 2, and which may be applied in a similar manner. The structure may then be singulated to form a device structure 100 and debonded from the carrier substrate 102, which may be performed using techniques similar to those described above with respect to FIG. 4.

Figure 5:
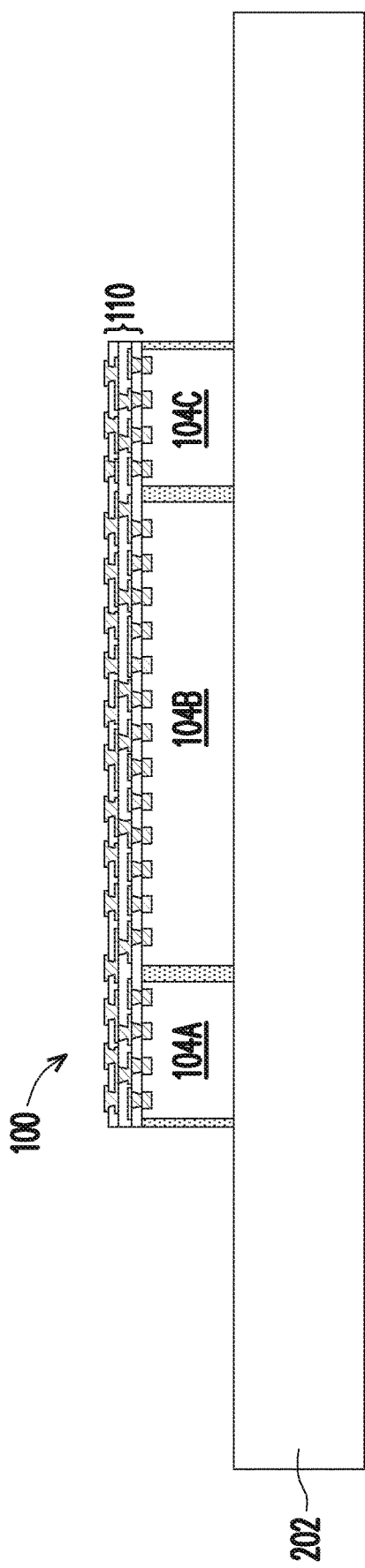
FIGS. 5 through 8 illustrate cross-sectional views of intermediate steps of forming a device structure, in accordance with some embodiments.

FIGS. 5-8 illustrate cross-sectional views of intermediate steps of forming a device structure 200 (see FIG. 8), in accordance with some embodiments. With reference now to FIG. 5, there is shown a carrier substrate 202 on which device structure 100 has been placed, in accordance with some embodiments. The carrier substrate 202 may include, for example, silicon-based materials, such as a silicon substrate (e.g., a silicon wafer), a glass material, silicon oxide, or other materials, such as aluminum oxide, the like, or a combination. In some embodiments, the carrier substrate 202 may be a panel structure formed from a suitable material. The carrier substrate 202 may be planar in order to accommodate an attachment of devices such as the device structure 100 or other devices. In some embodiments, a release layer (not shown) may be formed on the top surface of the carrier substrate 202 to facilitate subsequent debonding of the carrier substrate 202. The release layer may be similar to the release layer described previously with respect to FIG. 1, or may be a different type of release layer. The top surface of the release layer may be leveled and may have a high degree of co-planarity.

In some embodiments, the device structure 100 is placed on the carrier substrate 202 using a suitable process such as a pick-and-place process. FIG. 5 shows a single device structure 100 placed on the carrier substrate 202, but in other embodiments two or more devices or device structures may be placed on the carrier substrate 202. Example devices may include other semiconductor devices, integrated circuit devices, integrated passive devices, the like, or a combination thereof. Example device structures may include device structures similar to device structure 100 or different than device structure 100. In some embodiments, the devices or device structures may include more than one of the same type of device or device structure. It will be appreciated that the device structure 100 shown in FIGS. 5-8 is an example, and any suitable devices or device structures may be attached to the carrier substrate 202 singly or in combination, and all such configurations are considered within the scope of this disclosure.

Figure 6:
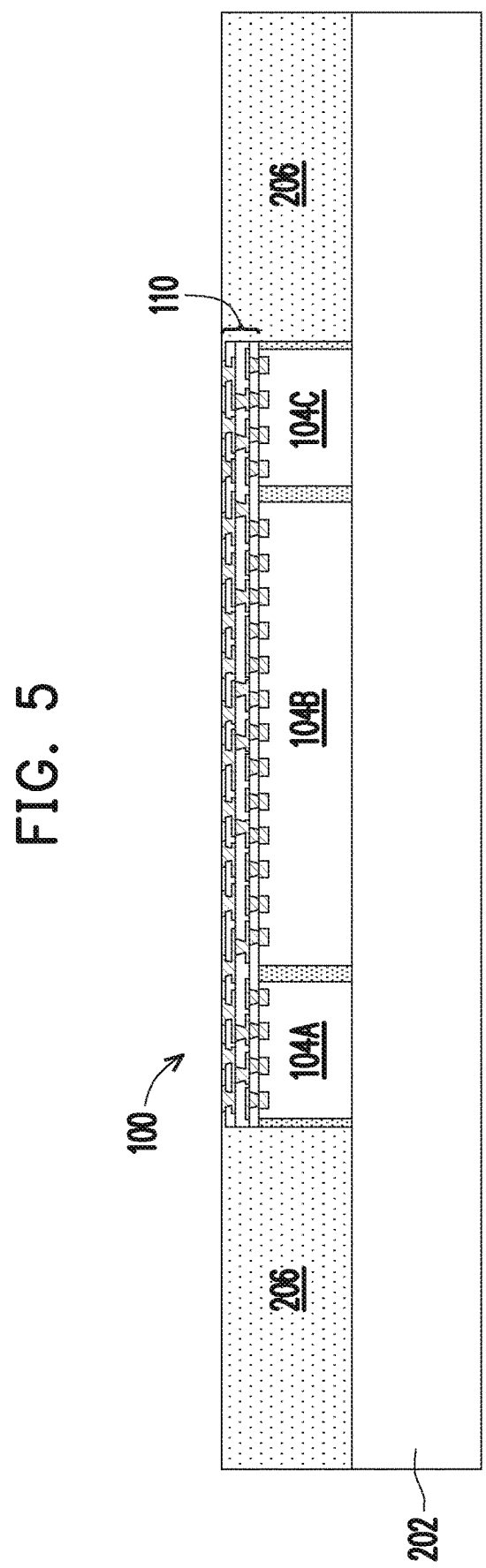

FIG. 6 illustrates an encapsulation of the device structure 100 using an encapsulant 206, in accordance with some embodiments. The encapsulation may be performed in a molding device or the encapsulant 206 may be deposited using another technique. The encapsulant 206 may be a material similar to the encapsulant 106 described above with respect to FIG. 2, or may be a different material. FIG. 6 also illustrates a thinning of the encapsulant 206 in order to expose the device structure 100. The thinning may expose portions of the redistribution layer 109C of the device structure 100 or other conductive regions (e.g., contacts, bonding pads, etc.) to which electrical connections may be made. The thinning may be performed, e.g., using a mechanical grinding or chemical mechanical polishing (CMP). As such, the device structure 100 may have a planar surface that is also planar with the encapsulant 206.

Figure 7:
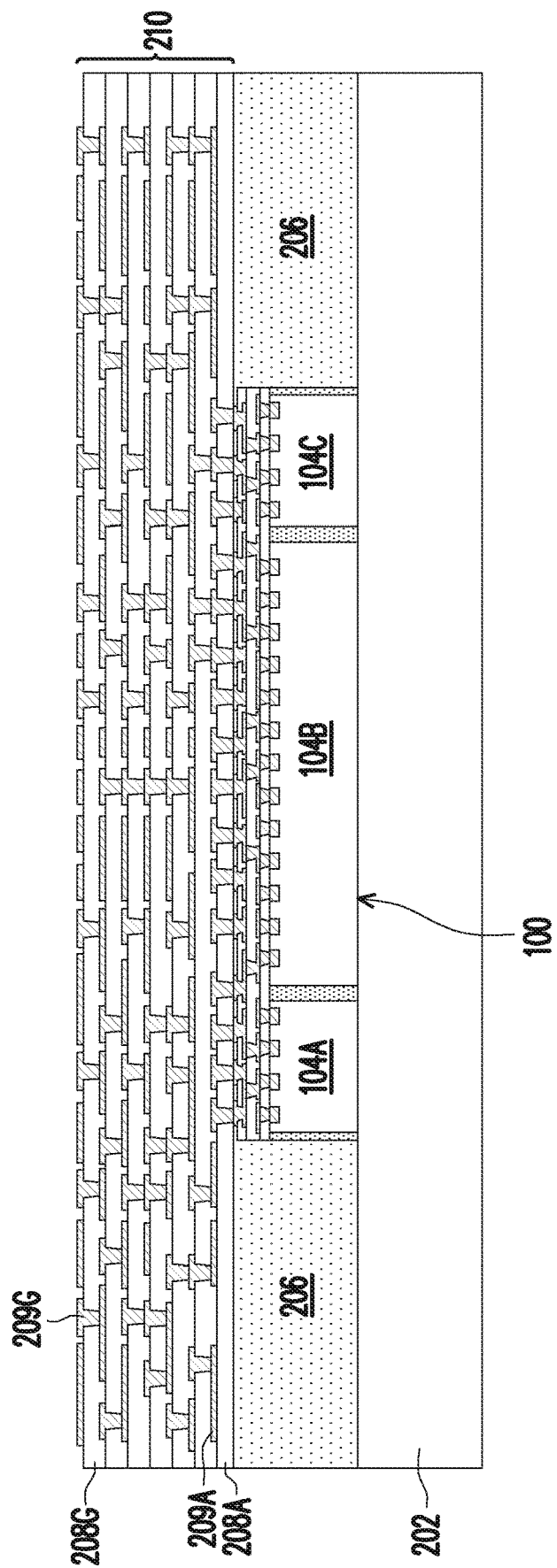

Turning to FIG. 7, a second redistribution structure 210 is formed over the device structure 100 and the encapsulant 206, in accordance with some embodiments. The second redistribution structure 210 shown includes insulating layers 208A-G (for clarity, only insulating layers 208A and 208G are labeled) and includes redistribution layers 209A-G (for clarity, only redistribution layers 209A and 209G are labeled). In other embodiments, different numbers of insulating layers or redistribution layers may be formed in the second redistribution structure 210 than described herein. For example, in some embodiments, the second redistribution structure 210 may include between about 1 and about 15 insulation layers or redistribution layers.

The second redistribution structure 210 may be formed using a process similar to the first redistribution structure 110, described above with respect to FIG. 3, or may be formed using a different process. In some embodiments, the insulating layer 208A is formed over device structure 100 and the encapsulant 206. The insulating layer 208A may be made of a material such as a polymer material or a polyimide material, a material similar to those described above for the insulating layer 108A (see FIG. 3), the like, or a combination thereof. The insulating layer 208A may be formed by a process such as spin-coating, lamination, CVD, the like, or a combination thereof. The insulating layer 208A may have a thickness of between about 2 μm and about 50 μm, such as about 15 μm, although any suitable thickness may be used.

Openings into the insulating layer 208A may be formed using a suitable photolithographic mask and etching process. For example, a photoresist may be formed and patterned over the insulating layer 208A, and one or more etching processes (e.g., a wet etching process or a dry etching process) are utilized to remove portions of the insulating layer 208A. In some embodiments, the insulating layer 208A is formed of a photosensitive polymer such as PBO, polyimide, BCB, or the like, in which openings may be patterned directly using a photolithographic mask and etching process. The openings in the insulating layer 208A may expose portions of the first redistribution structure 110 of the device structure 100 in order to subsequently make electrical connections to the second redistribution structure 210.

The redistribution layer 209A is then formed over the insulating layer 208A. In an embodiment, the redistribution layer 209A may be formed by initially forming a seed layer (not shown) of one or more layers of titanium, copper, or a titanium-copper alloy using a suitable formation process such as PVD, CVD, sputtering, or the like. The seed layer is formed over the insulating layer 208A and over portions of the first redistribution structure 110 of the device structure 100 that are exposed by openings in the insulating layer 208A. A photoresist (also not shown) may then be formed to cover the seed layer and then be patterned to expose those portions of the seed layer that are located where the redistribution layer 209A will subsequently be formed. Once the photoresist has been formed and patterned, a conductive material may be formed on the seed layer. The conductive material may be a material such as copper, titanium, tungsten, aluminum, another metal, the like, or a combination thereof. The conductive material may be formed through a deposition process such as electroplating or electroless plating, or the like. However, while the material and methods discussed are suitable to form the conductive material, these are merely examples. Any other suitable materials or any other suitable processes of formation, such as CVD or PVD, may alternatively be used to form the redistribution layer 209A. Once the conductive material has been formed, the photoresist may be removed through a suitable removal process such as ashing or chemical stripping. Additionally, after the removal of the photoresist, those portions of the seed layer that were covered by the photoresist may be removed through, for example, a suitable wet etch process or dry etch process, which may use the conductive material as an etch mask. The remaining portions of the seed layer and conductive material form the redistribution layer 209A. In this manner, the redistribution layer 209A may form electrical connections to the device structure 100.

In some embodiments, the redistribution layer 209A may form conductive traces having a line width between about 1 μm and about 50 μm. In some embodiments, the redistribution layer 209A may form conductive traces having a line space between about 1 μm and about 50 μm. In some embodiments, the redistribution layer 209A may form conductive traces having a line width roughness (LWR) between about Ra=0.01 μm and about Ra=0.5 μm. In some embodiments, the redistribution layer 209A may form conductive traces having a thickness between about 1 μm and about 20 μm. In some embodiments, the redistribution layer 209A may form vias having a diameter between about 2 μm and about 65 μm.

Additional insulating layers 209B-G and redistribution layers 209B-G may then be formed over the redistribution layer 209A and insulating layer 208A to provide additional routing along with electrical connection within the second redistribution structure 210. The insulating layers 209B-G and redistribution layers 209B-G may be formed in alternating layers, and may be formed using processes and materials similar to those used for the insulating layer 208A or the redistribution layer 209A. For example, an insulating layer (e.g., insulating layer 208B) may be formed over a redistribution layer (e.g., redistribution layer 209A), and then openings made through the insulating layer to expose portions of the underlying redistribution layer using a suitable photolithographic mask and etching process. A seed layer may be formed over the insulating layer and conductive material formed on portions of the seed layer, forming an overlying redistribution layer (e.g., redistribution layer 209B). These steps may be repeated to form a second redistribution structure 210 having a suitable number and configuration of insulation layers and redistribution layers. Alternatively, the insulating layer 208B-G or redistribution layers 209B-G may be formed differently than the insulating layer 208A or redistribution layer 209A. The insulating layers 208B-G may be formed to each have a thickness of between about 2 μm and about 50 μm, such as about 15 μm. In this manner, the second redistribution structure 210 may be formed that is electrically connected to the first redistribution structure 110 of the device structure 100. In some embodiments, the second redistribution structure 210 is a fan-out structure and the first redistribution structure 110 is also a fan-out structure. In other embodiments, the second redistribution structure 210 may be formed in a different process than described herein.

Figure 8:
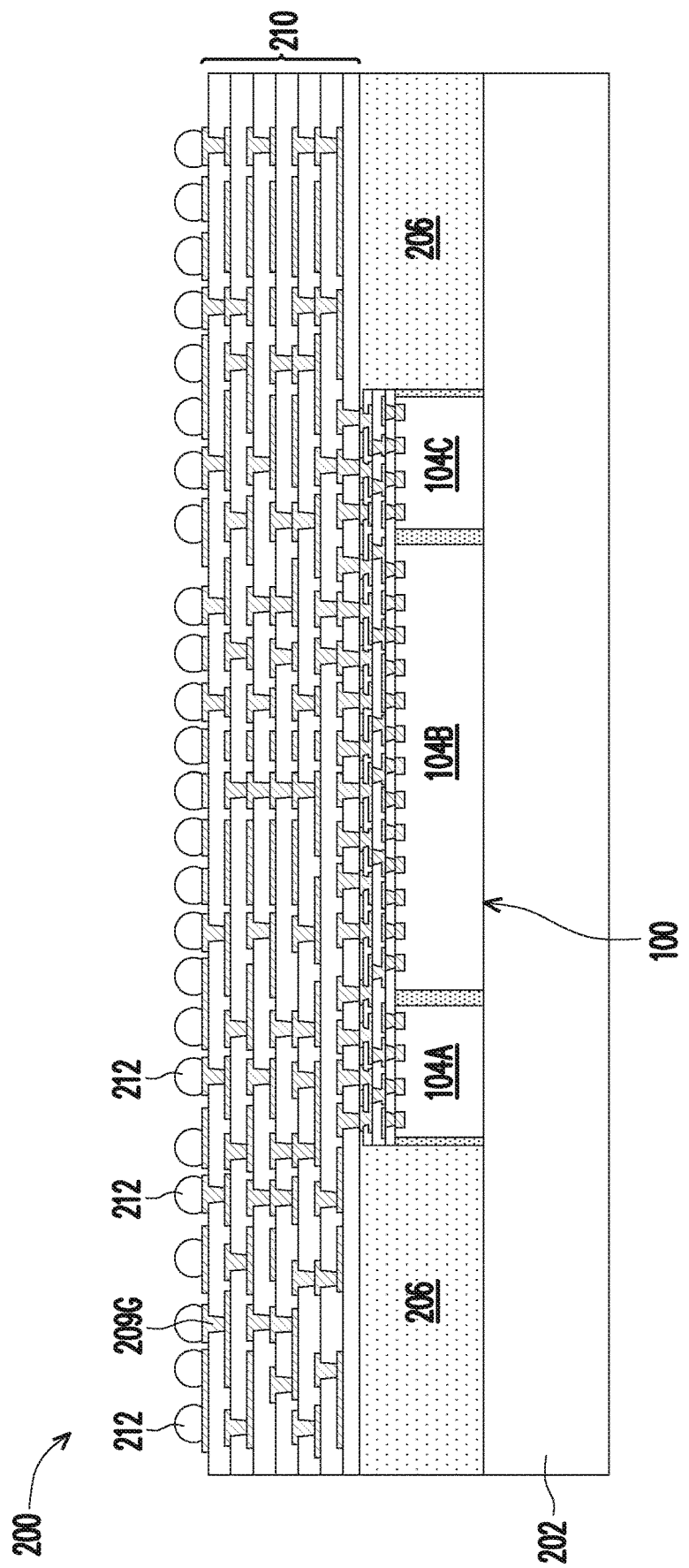
Figure 9C:
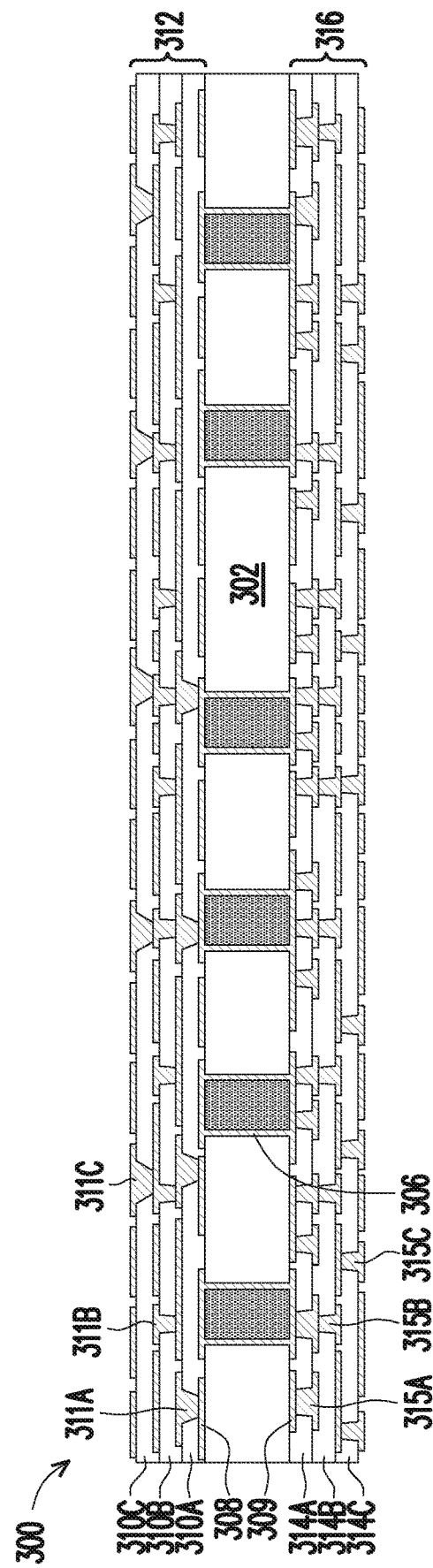

Turning to FIG. 8, external connectors 212 are formed on the second redistribution structure 210. In some embodiments, under-bump metallization structures (UBMs, not shown) are first formed on portions of the topmost redistribution layer of the redistribution structure 210 (e.g., redistribution layer 209G in FIG. 8). The UBMs may, for example, include three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs and are fully intended to be included within the scope of the current application. The UBMs may be created by forming each layer of the UBMs over the second redistribution structure 210. The forming of each layer may be performed using a plating process, such as electroplating or electroless plating, although other processes of formation, such as sputtering, evaporation, or PECVD process, may alternatively be used depending upon the desired materials. Once the desired layers have been formed, portions of the layers may then be removed through a suitable photolithographic masking and etching process to remove the undesired material and to leave the UBMs in a desired shape, such as a circular, octagonal, square, or rectangular shape, although any desired shape may alternatively be formed. In some embodiments, the UBMs are formed over the topmost redistribution layer as part of formation of the second redistribution structure 210, which may include using the same photolithographic steps used to form the topmost redistribution layer. For example, layers of the UBMs may be deposited over the topmost redistribution layer, and then excess material of the topmost redistribution layer and the UBMs removed in the same process.

Still referring to FIG. 8, external connectors 212 are formed over the second redistribution structure 210. The external connectors 212 may be formed over UBMs, if present. The external connectors 212 may be, for example, contact bumps or solder balls, although any suitable types of connectors may be utilized. In an embodiment in which the external connectors 212 are contact bumps, the external connectors 212 may include a material such as tin, or other suitable materials, such as silver, lead-free tin, or copper. In an embodiment in which the external connectors 212 are tin solder bumps, the external connectors 212 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 212. In some embodiments, the external connectors 212 may have a thickness between about 2 μm and about 500 μm. In some embodiments, the external connectors 212 may have a pitch between about 25 μm and about 1000 μm. In this manner, a device structure 200 may be formed that includes a device structure 100 and a second redistribution structure 210. However, in other embodiments, the device structure 200 may be formed using other processes. In some embodiments, external connectors 212 are not formed on the device structure 200, described in greater detail below with respect to FIGS. 10 and 11.

Turning to FIGS. 9A-C, cross-sectional views of intermediate steps of forming an interconnect structure 300 (see FIG. 9C) are shown, in accordance with some embodiments. The interconnect structure 300 is attached to the device structure 200 (see FIGS. 10-11) and provides additional electrical routing. The interconnect structure 300 is free of active devices. In some embodiments, the interconnect structure 300 may be, for example, an interposer or a "semi-finished substrate." The interconnect structure 300 can also provide stability and rigidity to an attached device structure 200, and can reduce warping of an attached device structure 200. FIG. 9A shows a cross-sectional view of a core substrate 302 having conductive layers 304 disposed on opposite surfaces, in accordance with some embodiments. In some embodiments, the core substrate 302 may include a material such as Ajinomoto build-up film (ABF), a pre-impregnated composite fiber (prepreg) material, an epoxy, a molding compound, an epoxy molding compound, fiber-glass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 302 may have a thickness between about 30 μm and about 2000 μm, such as about 800 μm or about 1200 μm. The conductive layers 304 may be one or more layers of copper, nickel, aluminum, other conductive materials, the like, or a combination thereof laminated or formed onto opposing sides of the core substrate 302. In some embodiments, the conductive layers 304 may have a thickness between about 1 μm and about 30 μm.

Referring to FIG. 9B, openings (not shown) are formed in the core substrate 302 within which through vias 306 are formed (described below). In some embodiments, the openings are formed by, for example, a laser drilling technique. Other processes, e.g., mechanical drilling, etching, or the like, may also be used in other embodiments. In some embodiments, an optional surface preparation process may be performed after the openings are formed. The surface preparation process may include a process that cleans exposed surfaces of the core substrate 302 and conductive layers 304 with one or more cleaning solutions. The cleaning solutions may include sulfuric acid, chromic acid, a neutralizing alkaline solution, a water rinse, the like, or a combination. In some cases, the surface preparation process removes or reduces residues, oils, native oxide films, etc. In some embodiments, an optional desmear process may be performed to clean regions near the openings. The desmear process may be performed in addition to or instead of the surface preparation process. For example, the desmear process may remove residual material of the core substrate 302. The desmear process may be accomplished mechanically (e.g., blasting with a fine abrasive in a wet slurry), chemically (e.g., rinsing with a combination of organic solvents, permanganate etc.), or by a combination of mechanical and chemical desmearing. Following the surface preparation process or desmear process, a conditioning treatment may be performed using a chemical conditioner that facilitates adsorption of an activator used during subsequent electroless plating. In some embodiments, the conditioning treatment may be followed by micro-etching of the conductive layers 304 to roughen the conductive surface for better bonding between the conductive layers 304 and subsequently deposited conductive material for routing layers 308 and 309 (described below).

Still referring to FIG. 9B, conductive material is deposited to form a routing layer 308 on a side of the core substrate 302 and through vias 306 within the openings in the core substrate 302. In some embodiments, the routing layer 308 and through vias 306 are formed by first forming a patterned mask over the core substrate 302. The patterned mask may be, for example, a patterned photoresist layer. Openings in the patterned mask expose portions of the conductive layer 304 on which conductive material will subsequently be formed. The openings in the patterned mask also may expose the openings in the core substrate 302. The conductive material may then be deposited on the exposed regions of the conductive layer 304 and within the openings in the core substrate 302 using, for example, a plating process, an electroless plating process, or another process. In some embodiments, the conductive material is deposited having a thickness between about 2 µm and about 50 µm. After depositing the conductive material, the patterned mask layer (e.g., the photoresist) may be removed using a wet chemical process or a dry process (e.g., an ashing process). Portions of the conductive layer 304 that were covered by the patterned mask layer may be removed with the patterned mask layer or using a separate etching process. In this manner, a routing layer 308 is formed on a side of the core substrate 302. A similar process may then be performed on the opposite side of the core substrate 302 to form a routing layer 309 (and/or remaining portions of through vias 306) on the opposite side of the core substrate 302. In this manner, the conductive material may form routing layers 308 and 309 on opposite sides of the core substrate 302 and through vias 306 extending through the core substrate 302.

In some embodiments, after forming the conductive material along sidewalls of the openings, the openings may then be filled with a dielectric material 307 as illustrated in FIG. 9B. The dielectric material 307 may provide structural support and protection for the conductive material. In some embodiments, the dielectric material 307 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the dielectric material 307 may include pigments or dyes (e.g., for color), or other fillers and additives that modify rheology, improve adhesion, or affect other properties of the dielectric material 307. The dielectric material 307 may be formed using, e.g., a spin-on process or another process. In some embodiments, the conductive material may completely fill the through vias 306, omitting the dielectric material 307.

Turning to FIG. 9C, dielectric layers and additional routing layers may be formed over the routing layers 308 and 309 to form routing structures 312 and 316. The routing structures 312 and 316 are formed on opposite sides of the core substrate 302 and may provide additional electrical routing within the interconnect structure 300. The routing structure 312 is electrically connected to the routing layer 308 and includes alternating dielectric layers 310A-C and routing layers 311A-C. The routing structure 316 is electrically connected to the routing layer 309 and includes alternating dielectric layers 314A-C and routing layers 315A-C. Each of the routing structures 312 or 316 may have any suitable number of dielectric layers or routing layers, including more or fewer than shown in FIG. 9C. In some embodiments, one or both of routing structures 312 or 316 may be omitted. In some cases, the number of routing layers in routing structure 312 or 316 may be reduced by increasing the number of redistribution layers in the first redistribution structure 110 and/or the second redistribution structure 210.

In some embodiments, the routing structure 312 is formed by forming a dielectric layer 310A over the routing layer 308 and the core substrate 302. In some embodiments, the dielectric layer 310A may be a material such as a build-up material, ABF, a prepreg material, a laminate material, another material similar to those described above for the core substrate 302, the like, or combinations thereof. The dielectric layer 310A may be formed by a lamination process, a coating process, or another suitable process. In some embodiments, the dielectric layer 310A may have a thickness between about 2 µm and about 50 µm. In some embodiments, a conductive layer (not shown) may be formed over the dielectric layer 310A, which may act as a seed layer for forming conductive material (described below). The conductive layer may be e.g., a metal foil such as a copper foil, or another type of material such as those described above for conductive layer 304. Openings (not shown) are formed in the dielectric layer 310A that expose portions of the routing layer 308 for subsequent electrical connection. In some embodiments, the openings are formed by, for example, a laser drilling technique. Other processes, e.g., mechanical drilling, etching, or the like, may also be used in other embodiments. In some embodiments, an optional surface preparation process (e.g., a desmear process or the like) may be performed after the openings are formed.

A conductive material is then deposited to form routing layer 311A on the dielectric layer 310A and within the openings in the dielectric layer 310A. In some embodiments, the routing layer 311A is formed by first forming a patterned mask over the dielectric layer 310A. The patterned mask may be, for example, a patterned photoresist layer. Openings in the patterned mask may expose portions of the dielectric layer 310A (or, if present, a conductive layer on the dielectric layer 310A) on which conductive material will subsequently be formed. The openings in the patterned mask also may expose the openings in the dielectric layer 310A. The conductive material may then be deposited on the exposed regions of the dielectric layer 310A and within the openings in the dielectric layer 310A using, for example, a plating process, an electroless plating process, or another process. In some embodiments, the conductive material is deposited having a thickness between about 2 µm and about 50 µm. After depositing the conductive material, the patterned mask layer (e.g., the photoresist) may be removed using a wet chemical process or a dry process (e.g., an ashing process). In this manner, an additional routing layer 311A is formed over and electrically connected to the routing layer 308.

In some embodiments, the routing layer 311A may form conductive traces having a line width between about 1 μm and about 50 μm. In some embodiments, the routing layer 311A may form conductive traces having a line space between about 1 μm and about 50 μm. In some embodiments, the routing layer 311A may form conductive traces having a line width roughness (LWR) between about Ra=0.01 μm and about Ra=0.5 μm. In some embodiments, the routing layer 311A may form conductive traces having a thickness between about 1 μm and about 20 μm. In some embodiments, the routing layer 311A may form vias having a diameter between about 2 μm and about 65 μm.

Additional dielectric layers 310B-C and routing layers 311B-C may then be formed over the routing layer 311A and dielectric layer 310A to provide additional routing along with electrical connection within the routing structure 312. The dielectric layers 310B-C and routing layers 311B-C may be formed in alternating layers, and may be formed using processes and materials similar to those used for the dielectric layer 310A or the routing layer 311A. For example, a dielectric layer (e.g., dielectric layer 310B) may be formed over a routing layer (e.g., routing layer 311A), and then openings made through the dielectric layer to expose portions of the underlying routing layer using, e.g., a laser drilling process. A patterned mask may be formed over the dielectric layer, and conductive material may then be formed and the patterned mask removed, forming a routing layer over the dielectric layer. These steps may be repeated to form a routing structure 312 having a suitable number and configuration of dielectric layers and routing layers.

In some embodiments, dielectric layers 314A-C and routing layers 315A-C may be formed over the routing layer 309 to form the routing structure 316. The routing structure 316 may be formed using a process similar to that of the routing structure 312, described above. For example, dielectric layers 314A-C may be formed alternating with routing layers 315A-C. Openings in a dielectric layer may be formed (e.g., using laser drilling) and conductive material deposited over the dielectric layer to form a routing layer. These steps may be repeated to form a routing structure 316 having a suitable number and configuration of dielectric layers and routing layers. The routing structure 316 may be electrically connected to the routing structure 312 by the through vias 306.

In some embodiments, a patterned protective layer (not shown) is formed over the routing structures 312 and 316 of the interconnect structure 300. The protective layer may be e.g., a solder resist material, and may be formed to protect the surfaces of the routing structures 312 or 316. In some embodiments, the protective layer may be a photosensitive material formed by printing, lamination, spin-coating, or the like. The photosensitive material may then be exposed to an optical pattern and developed, forming openings in the photosensitive material. In other embodiments, the protective layer may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protective layer may be formed and patterned over the routing structure 312 and the routing structure 316 using the same techniques. In some embodiments, the protective layer may have a thickness between about 10 μm and about 300 μm. Other processes and materials may also be used.

In some embodiments, an optional solderability treatment may then be performed on the exposed surfaces of the topmost routing layers of the routing structures 312 or 316. For example, as shown in FIG. 9C, a solderability treatment may be performed on exposed surfaces of the routing layer 311C and on exposed surfaces of the routing layer 315C. The treatment may include an electroless nickel-electroless palladium-immersion gold technique (ENEPIG) process, an organic solderability preservative (OSP) process, or the like. In some embodiments, external connectors (not shown) such as solder bumps may be formed on one or both of the routing structures 312 or 316. The external connectors may, for example, be similar to external connectors 212 (see FIG. 8) or may be similar to external connectors 406, described below with respect to FIG. 13.

Figure 10:
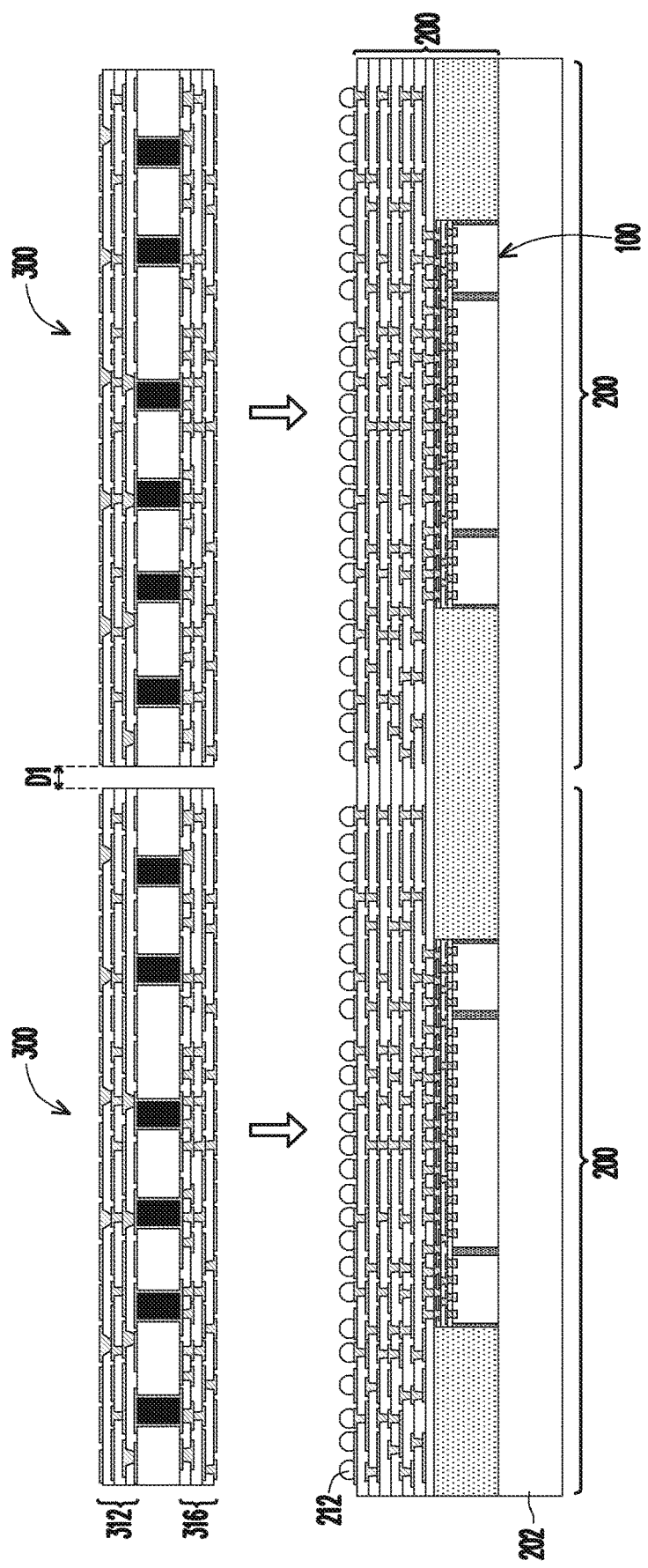
FIGS. 10 through 15 illustrate cross-sectional views of intermediate steps of forming a package, in accordance with some embodiments.

FIG. 10 illustrates a placement of interconnect structures 300 into electrical connection with device structures 200, in accordance with some embodiments. FIG. 10 shows an embodiment in which multiple, distinct interconnect structures 300 are to be bonded to multiple device structures 200 prior to singulating the multiple device structures. In an embodiment, the interconnect structures 300 are placed into physical contact with the external connectors 212 (on the device structure 200) using, e.g., a pick and place process. The interconnect structures 300 may be placed such that exposed regions of the topmost routing layer of a routing structure are aligned with corresponding external connectors 212. For example, the regions of the routing layer 311C (see FIG. 9C) of the routing structure 312 or regions of the routing layer 315C of the routing structure 316 (see FIG. 9C) may be placed in physical contact with the external connectors 212. Once in physical contact, a reflow process may be utilized to bond the external connectors 212 of the device structures 200 to the interconnect structures 300. In some embodiments, external connectors are formed on the interconnect structures 300 instead of or in addition to the external connectors 212 formed on the device structure 200. In some embodiments, external connectors 212 are not formed on the device structures 200, and the interconnect structures 300 are bonded to the devices structures 200 using a direct bonding technique such as a thermocompression bonding technique.

In the embodiment shown in FIG. 10, the device structures 200 are shown prior to singulation. In other embodiments, the device structures 200 may be singulated prior to attachment of the interconnect structures 300. As shown in FIG. 10, adjacent interconnect structures 300 may be placed such that a gap D1 is present between them. In some embodiments, the spacing of adjacent device structures 200 may be controlled such that the gap D1 is a certain distance or within a certain range of distances. For example, the gap D1 may be a distance between about 5 μm and about 2000 μm. In some cases, the gap D1 distance may be controlled in order to avoid collision between adjacent interconnect structures 300 during placement. In some cases, the gap D1 distance may be controlled to facilitate subsequent deposition of molding underfill 402, described below with respect to FIG. 12.

Figure 11:
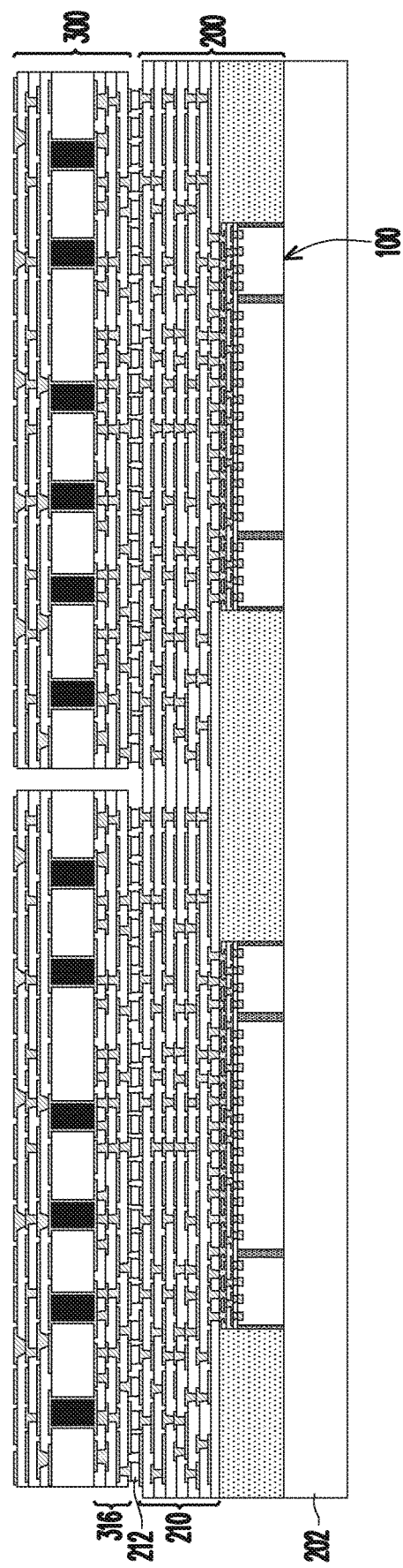
Figure 12:
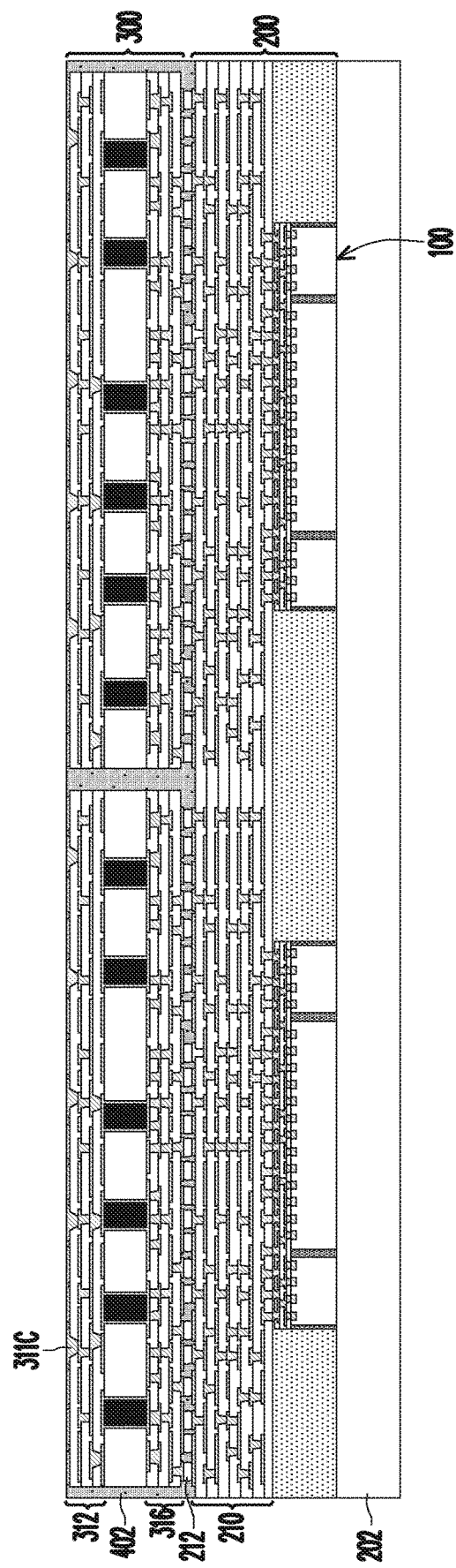

FIG. 11 shows a interconnect structure 300 attached to a device structure 200, in accordance with some embodiments. In some embodiments, the vertical distance between the bottom dielectric layer of the interconnect structure 300 and the top insulating layer of the device structure 200 is between about 10 μm and about 1000 μm. In FIG. 12, an underfill 402 is deposited along the sidewalls of the interconnect structure 300 and in the gap between the interconnect structure 300 and the device structure 200. The underfill 402 may be a material such as a molding compound, an epoxy, an underfill, a molding underfill (MUF), a resin, or the like. The underfill 402 can protect the external connectors 212 and provide structural support for the device structure. In some embodiments, the underfill 402 may be cured after deposition. In some embodiments, the underfill 402 may be thinned after deposition. The thinning may be performed, e.g., using a mechanical grinding or CMP process. In some embodiments, the underfill 402 may be deposited over the routing structure 312, and the thinning may expose the topmost routing layer of the routing structure 312 (e.g., routing layer 311C).

Figure 13:
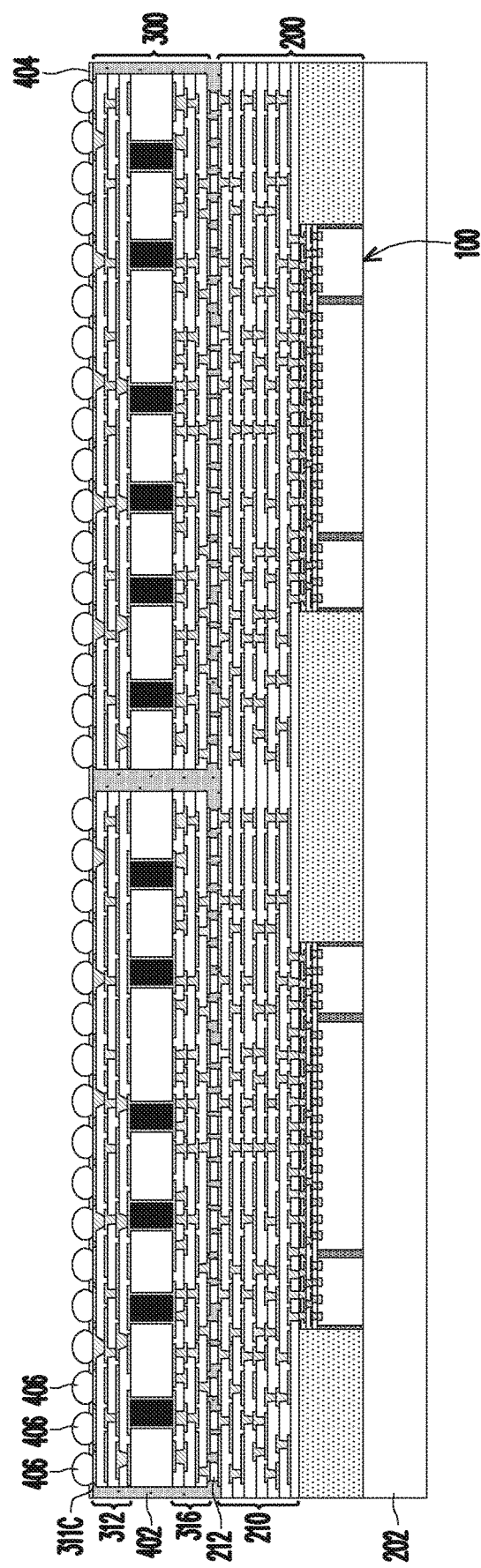

In FIG. 13, external connectors 406 are formed over and electrically connected to the interconnect structure 300. The external connectors 406 may be formed on exposed portions of the topmost routing layer of the routing structure 312 (e.g., routing layer 311C). In some embodiments, UBMs are formed on the routing structure 312, and the external connectors 406 are formed over the UBMs. In some embodiments a protective layer 404 is first formed over the routing structure 312. The protective layer 404 may be formed over UBMs, if present. The protective layer 404 may be formed from one or more suitable dielectric materials such as polybenzoxazole (PBO), a polymer material, a polyimide material, a polyimide derivative, an oxide, a nitride, the like, or a combination thereof. The protective layer 404 may be formed by a process such as spin-coating, lamination, CVD, the like, or a combination thereof. The protective layer 404 may have a thickness of between about 0.5 µm and about 50 µm, such as about 20 µm, although any suitable thickness may be used.

Openings may then be formed in the protective layer 404 to expose portions of the routing structure 312 (which may include UBMs, if present). The openings in the protective layer 404 may be formed using a suitable technique such as laser drilling or a photolithographic mask and etching process. The external connectors 406 are then formed over the exposed portions of the routing structure 312, and make electrical connection to the routing structure 312. The external connectors 406 may be, for example, contact bumps or solder balls, although any suitable types of connectors may be utilized. In an embodiment in which the external connectors 406 are contact bumps, the external connectors 406 may include a material such as tin, or other suitable materials, such as silver, lead-free tin, or copper. In an embodiment in which the external connectors 406 are tin solder bumps, the external connectors 406 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the external connectors 406. In some embodiments, the external connectors 406 may have a thickness between about 2 µm and about 1000 µm. In some embodiments, the external connectors 406 may have a pitch between about 250 µm and about 1250 µm. In some embodiments, the external connectors 406 may be similar to external connectors 212 described above with respect to FIG. 8.

Figure 14:
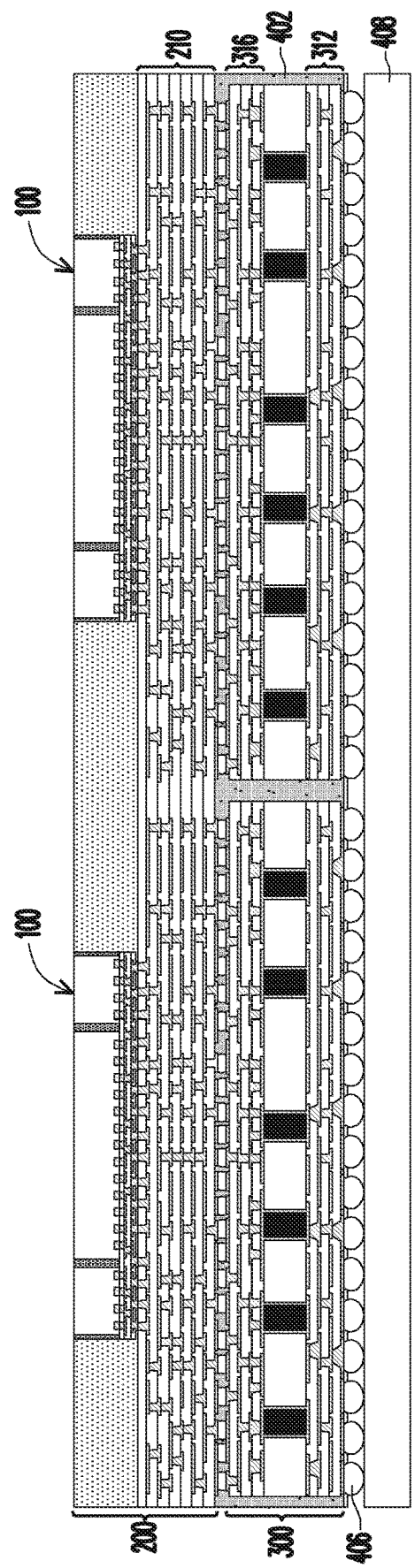

FIG. 14 illustrates a debonding of the carrier substrate 202 and attachment of the resulting structure to a carrier structure 408. The carrier structure 408 may be, for example, a tape, a frame, a ring, or another suitable structure. Once the structure is attached to the carrier structure 408, the carrier substrate 202 may be debonded from the structure. In accordance with some embodiments in which a release layer is present, the debonding may include projecting a light such as a laser light or an UV light on the release layer so that the release layer decomposes under the heat generated by the light and the carrier substrate 202 be removed from the structure.

Figure 15:
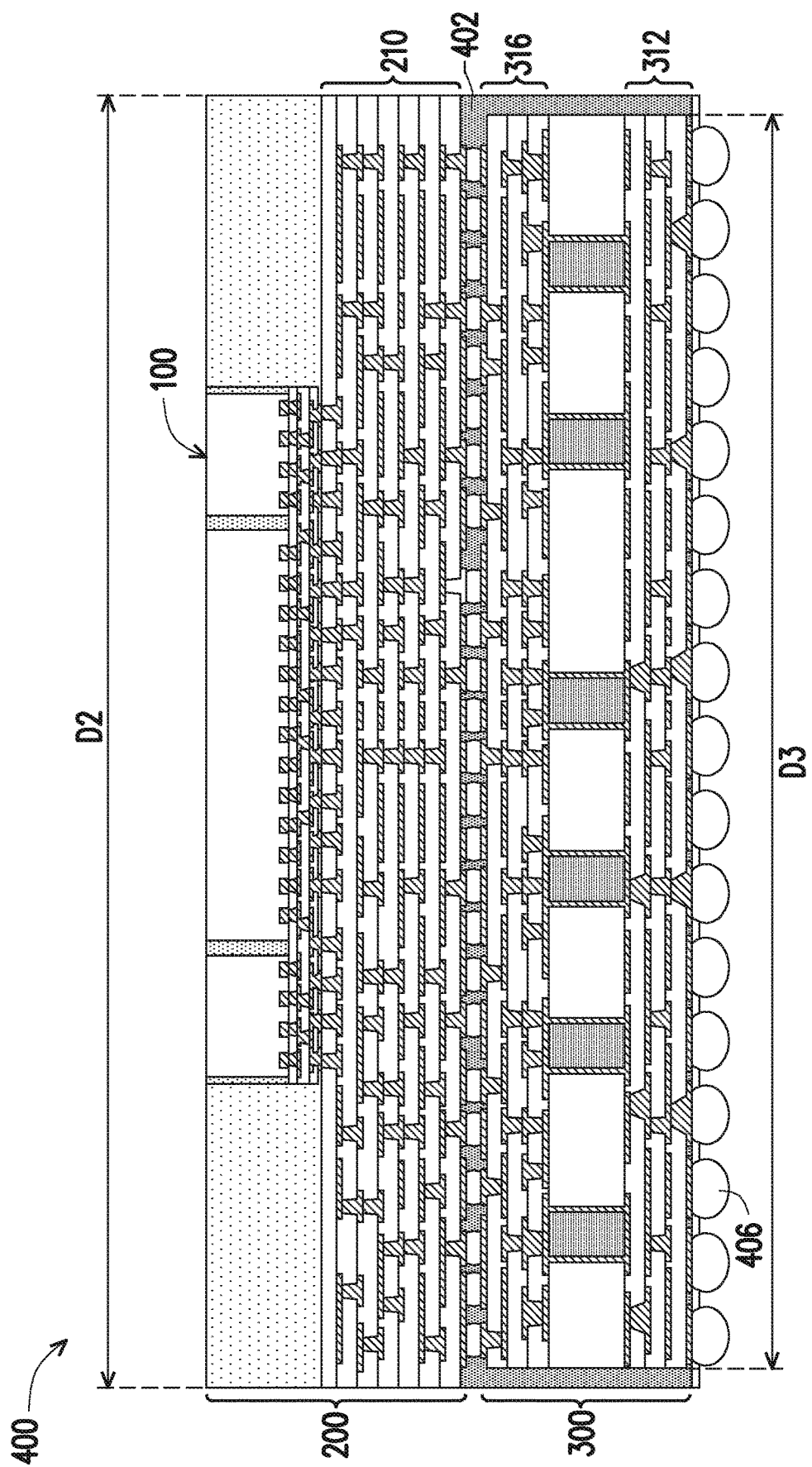

FIG. 15 illustrates a singulation and debonding to form package 400, in accordance with some embodiments. In an embodiment, the structure may be singulated using one or more saw blades that separate the structure into discrete pieces, forming one or more singulated packages 400 attached to the carrier structure 408. However, any suitable method of singulation, including laser ablation or one or more wet etches, may also be utilized. After singulation, the package 400 may be removed from the carrier structure 408. In some embodiments, the package 400 may have lateral dimensions between about 30 mm by 30 mm and about 200 mm by 200 mm, such as about 100 mm by 100 mm, though a package 400 may have other dimensions than these. In some embodiments, the package 400 may have a vertical thickness between about 500 µm and about 5000 µm.

Forming a package 400 that includes an interconnect structure 300 attached to a device structure 200 as described herein may achieve advantages. For example, a structure having larger lateral dimensions may be more prone to warping or delamination. An interconnect structure 300 as described herein may be relatively rigid and thus may provide structural support for the device structure 200, reducing warping of the device structure 200.

In some cases, the redistribution structures no and 210 may be formed using more robust and reliable techniques than the routing structures 312 or 316. For example, the redistribution structures no and 210 may be formed (e.g., in a semiconductor fabrication plant) using a fan-out process, whereas the routing structures 312 and 316 may be formed using a build-up process. By using a more robust process, the redistribution structures 110 and 210 may have higher a yield than the routing structures 312 and 316. In some cases, the process for forming the redistribution structures no and 210 may form redistribution layers having smaller dimensions and having less line width roughness than the process for forming routing layers in the routing structures 312 and 316. Thus, the redistribution structures no and 210 may have improved electrical performance relative to the routing structures 312 and 316, particularly in the case of high frequency operation.

In some cases, by forming the redistribution structures 110 and 210 as part of the device structure 200, the routing structures 312 or 316 of the interconnect structure may be formed having fewer layers. By forming more of the electrical routing of the package 400 within the redistribution structures 110 or 210 and less of the electrical routing within the routing structures 312 or 316, the overall electrical performance of the package 400 may be improved, as described previously. The redistribution structures 110 and 210 may have individual layers that are thinner than the individual layers of the routing structures 312 and 316, which can reduce overall size of the package 400. Additionally, the overall manufacturing cost of the package 400 may be reduced by forming more layers within the redistribution structures 110 or 210.

In some cases, materials of a package or device having large differences of the coefficient of thermal expansion (CTE) can cause delamination, shorts, or other failures at higher temperature operation. In some cases, the redistribution structures 110 or 210 may include materials having a CTE that is closer to the CTE of semiconductor devices 104A-C (or other materials in the package 400) than the CTE of materials of the interconnect structure 300. For example, the insulation layers of the redistribution structures 110 or 210 may have a CTE that is smaller than the CTE of the dielectric layers of the routing structures 312 or 316. Thus, by forming more of the electrical routing in the device structure 200 and forming less of the electrical routing in the interconnect structure 300, the reliability of the package 400 may be improved, particularly at higher temperature operation.

Still referring to FIG. 15, the package 400 shown includes a device structure 200 and an interconnect structure 300 in which the device structure 200 has larger lateral dimensions than the interconnect structure 300. For example, the device structure 200 may have a lateral width D2 that is greater than a lateral width D3 of the interconnect structure 300. Because the device structure 200 is wider than the interconnect structure 300, portions of the underfill 402 may remain on one or more sidewalls of the interconnect structure 300 after singulation. In some embodiments, the underfill 402 may have one or more sidewalls that are planar with sidewalls of the device structure 200. In some embodiments, the lateral width D3 may be between about 50% and about 100% of the lateral width D2. In some embodiments, the lateral width D2 may be between about 30 mm and about 200 mm. In some embodiments, the lateral width D3 may be between about 30 mm and about 200 mm.

Figure 16:
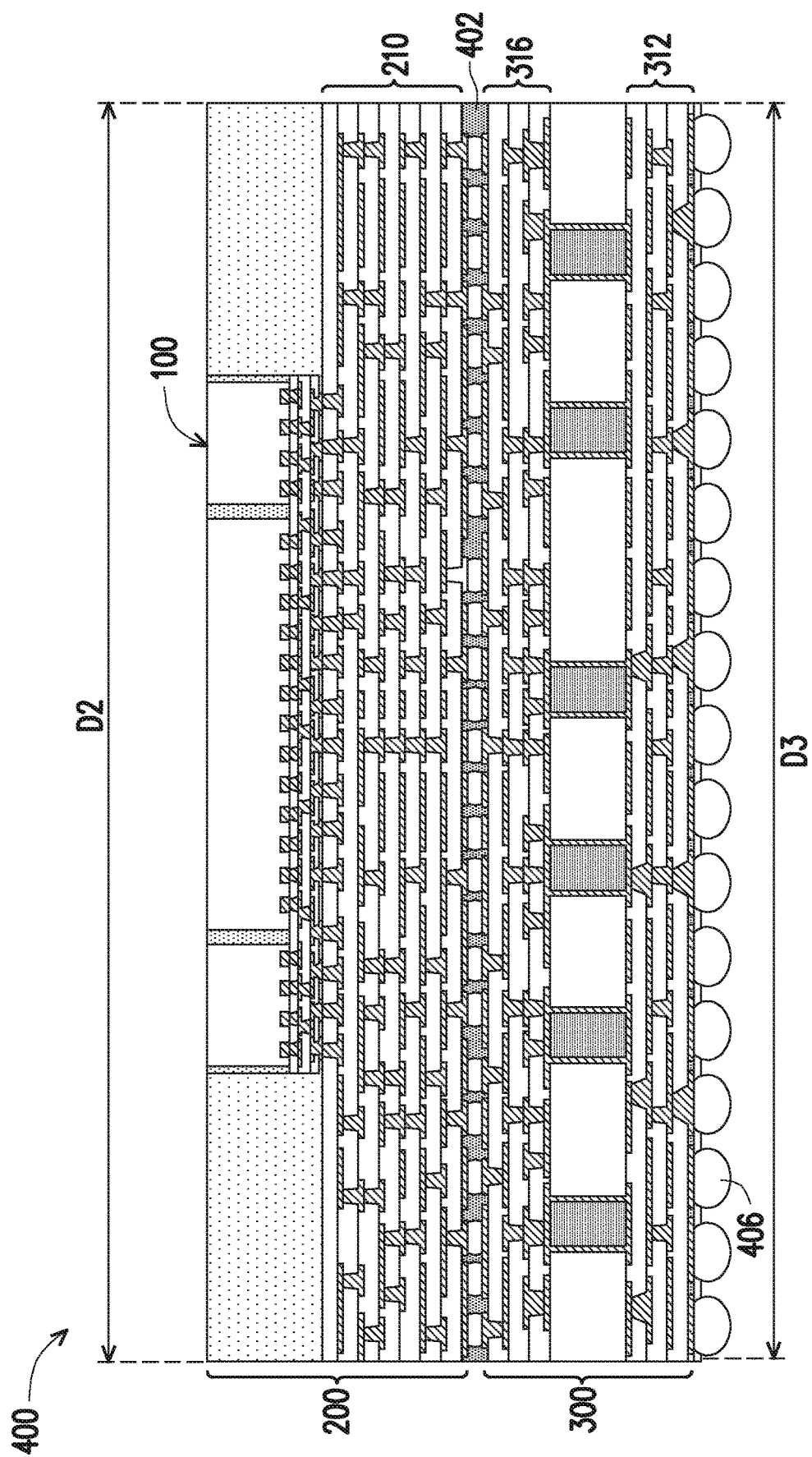
FIGS. 16 through 17 illustrate cross-sectional views of packages, in accordance with some embodiments.

Turning to FIG. 16, a package 400 is shown that includes a device structure 200 having about the same dimensions as an interconnect structure 300, in accordance with some embodiments. For example, the device structure 200 may have a lateral width D2 that is about the same as a lateral width D3 of the interconnect structure 300. Because the device structure 200 is about the same size as the interconnect structure 300, one or more sidewalls of the interconnect structure 300 may be free of underfill 402 after singulation. In some embodiments, the interconnect structure 300 may have one or more sidewalls that are planar with sidewalls of the device structure 200. The underfill 402 located between the device structure 200 and the interconnect structure 300 may also have sidewalls that are planar with sidewalls of the device structure 200 and the interconnect structure 300. A package 400 having planar sidewalls may be formed by, for example, using a saw during singulation that cuts through edge regions of the device structure 200, the interconnect structure 300, and the underfill 402.

Figure 17:
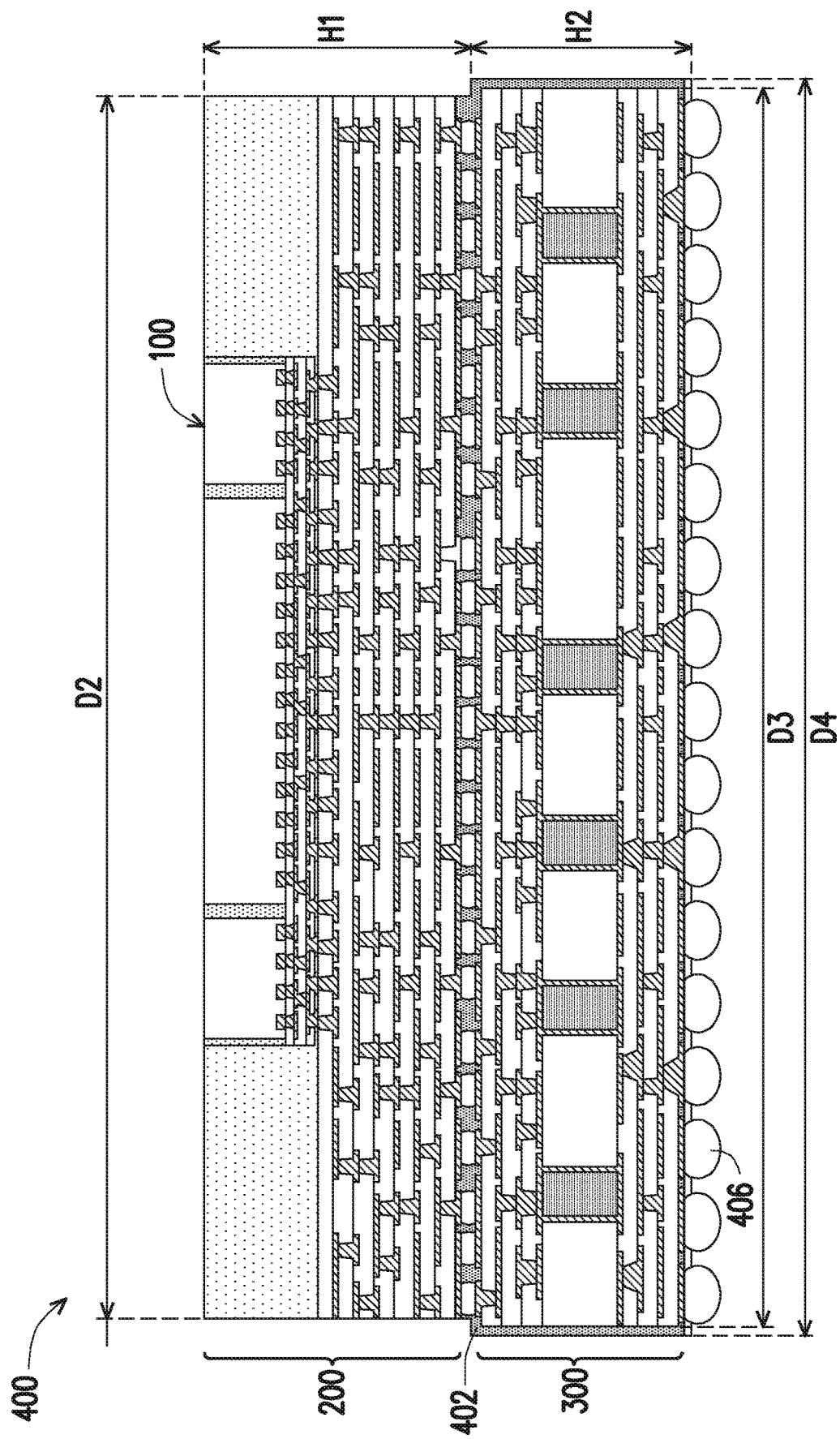

Turning to FIG. 17, the package 400 shown includes a device structure 200 and an interconnect structure 300 in which the device structure 200 has smaller lateral dimensions than the interconnect structure 300, in accordance with some embodiments. For example, the device structure 200 may have a lateral width D2 that is smaller than a lateral width D3 of the interconnect structure 300. Because the interconnect structure 300 is wider than the device structure 200, a two-part singulation process (described in greater detail below in FIGS. 18A-C) may be performed such that, after singulation, the package 400 has a lateral width D2 near the device structure 200 and a lateral width D4 near the interconnect structure 300. The lateral width D2 may be smaller than the lateral width D4, forming a stepped profile as shown in FIG. 17. Due to the two-part singulation process, portions of the underfill 402 may remain on one or more sidewalls of the interconnect structure 300 after singulation. In some embodiments, the remaining underfill 402 may have portions planar with sidewalls of the device structure 200. In some embodiments, the lateral width D3 may be between about 100% and about 150% of the lateral width D2. In some embodiments, the lateral width D4 may be between about 100% and about 150% of the lateral width D2. In some embodiments, the underfill 402 remaining on sidewalls of the interconnect structure 300 may have a thickness between about 1 μm and about 250 μm. In some embodiments, the interconnect structure 300 may be free of underfill 402 after singulation, such that the lateral width D3 and the lateral width D4 are the same. In some cases, the use of a two-part singulation process allows for the device structure 200 to have smaller dimensions, which can reduce warping or thermal effects.

Figure 18A:
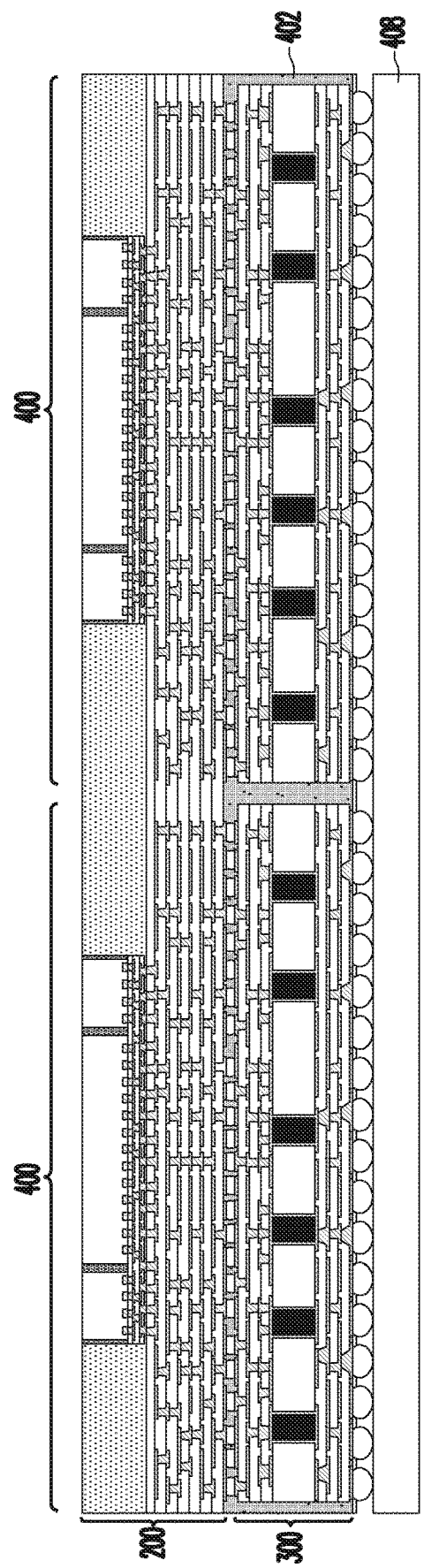
FIGS. 18A through 20C illustrate cross-sectional views of intermediate steps of singulating packages, in accordance with some embodiments.
Figure 18B:
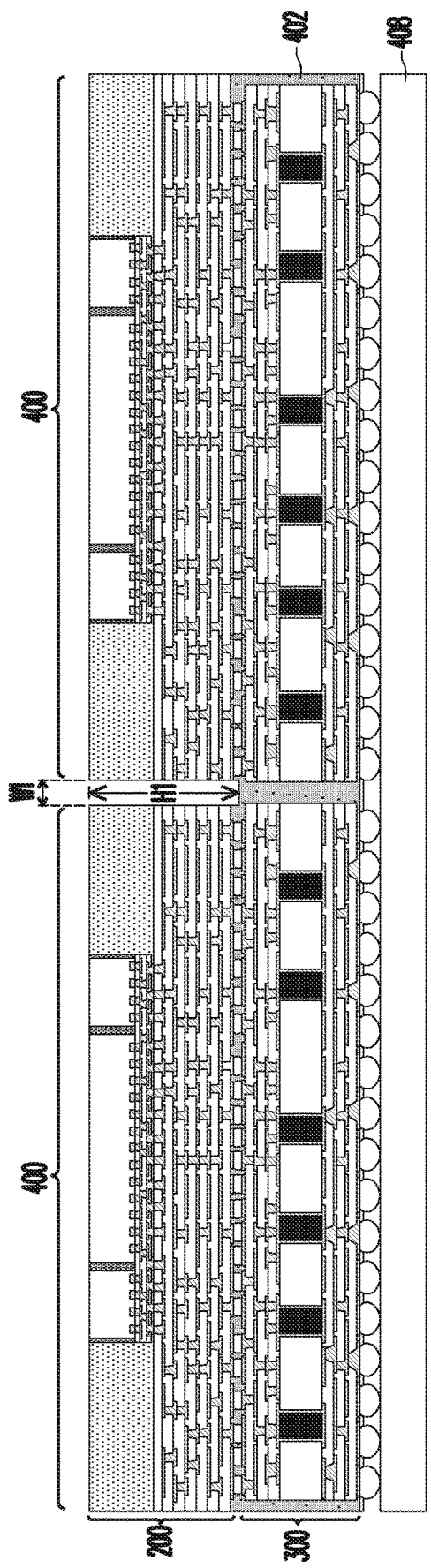
Figure 18C:
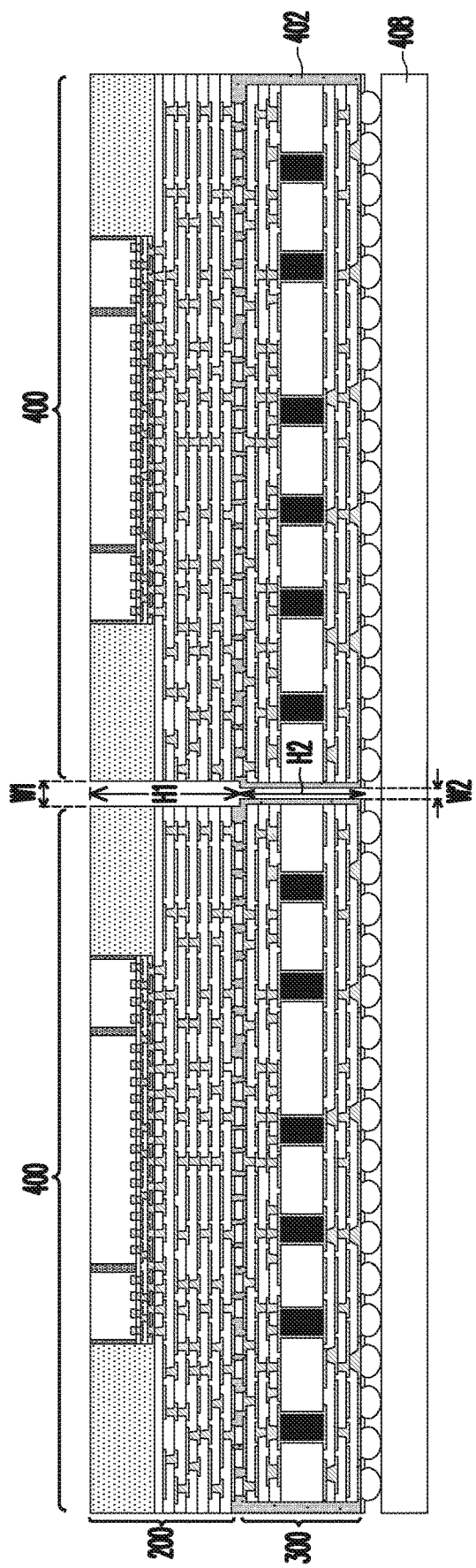

FIGS. 18A-C illustrate intermediate steps of two-part singulation process, in accordance with some embodiments. FIG. 18A shows packages 400 prior to singulation, similar to FIG. 14 described above. In FIG. 18B, the first step of the two-part singulation process is performed, in which the structure is first sawed in a region between the adjacent packages 400. This first sawing may saw a first trench having a depth H1 into the structure, which may be a depth between about 100 μm and about 2000 μm in some embodiments. The depth H1 may be greater than the thickness of the device structure 200. In some embodiments, the bottom of the first trench may be at a vertical location that is between the bottom surface of the device structure 200 and top surface of the interconnect structure 300 (see FIGS. 19A-C), which may be within the underfill 402. In some embodiments, the bottom of the first trench may be at a vertical location that is lower than the top surface of the interconnect structure 300 (see FIGS. 20A-C). The first trench may have a width W1 between about 5 μm and about 200 μm in some embodiments. In some embodiments, the width W1 is greater than the separation distance between adjacent interconnect structures (i.e., distance D1 shown in FIG. 10). The depth H1 or the width W1 may be determined based on the vertical and lateral dimensions of the device structures 200.

In FIG. 18C, the second step of the two-part singulation process is performed, in which the structure is further sawed to completely singulate adjacent packages 400. This second sawing may saw a second trench having a depth H2 into the first trench. The depth H2 is equal to the distance between the bottom of the first trench and the bottom surface of the packages 400, which may be a depth between about 100 μm and about 2000 μm in some embodiments. The depth H2 may be greater than, less than, or about the same as the thickness of the interconnect structure 300. The second trench may have a width W2 between about 5 μm and about 200 μm in some embodiments, which may be smaller than the width W1 of the first trench. In some embodiments, the width W2 may be between about 1% and about 100% of the width W1. In some embodiments, the width W2 is less than or about equal to the separation distance between adjacent interconnect structures (i.e., distance D1 shown in FIG. 10). The depth H2 or the width W2 may be determined based on the vertical dimensions, lateral dimensions, or separation distances of the interconnect structures 300. The center axis of the second trench may be aligned to the center axis of the first trench, but the center axis of the first trench and the center axis of the second trench may be offset from each other in other embodiments.

Figure 19A:
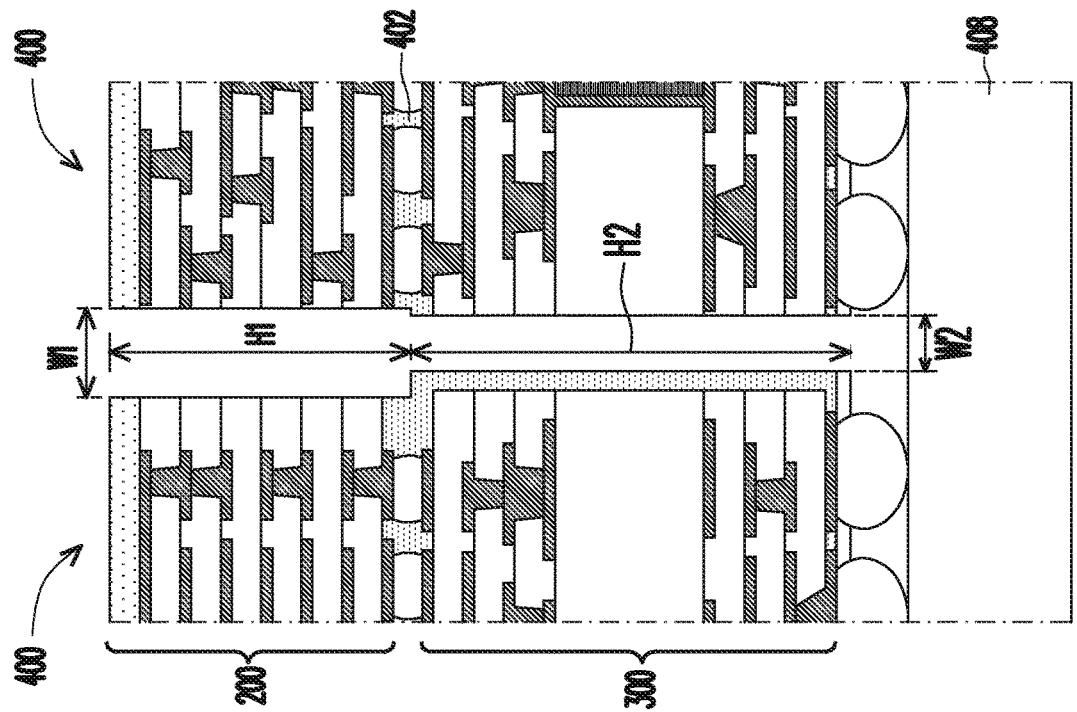
Figure 19B:
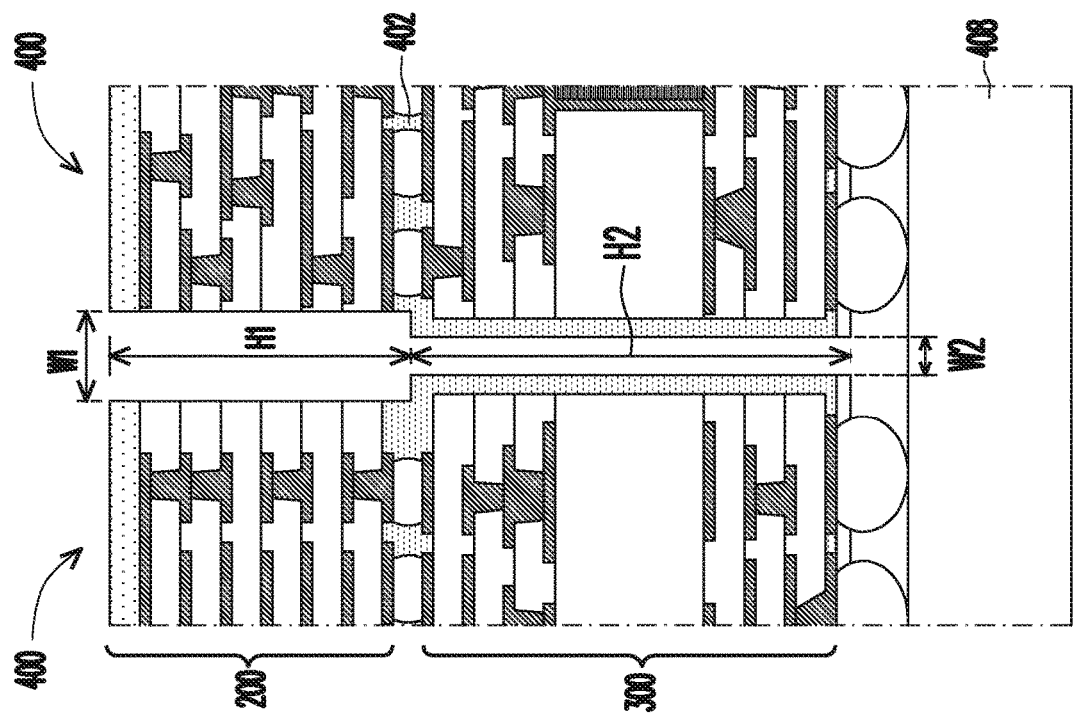
Figure 19C:
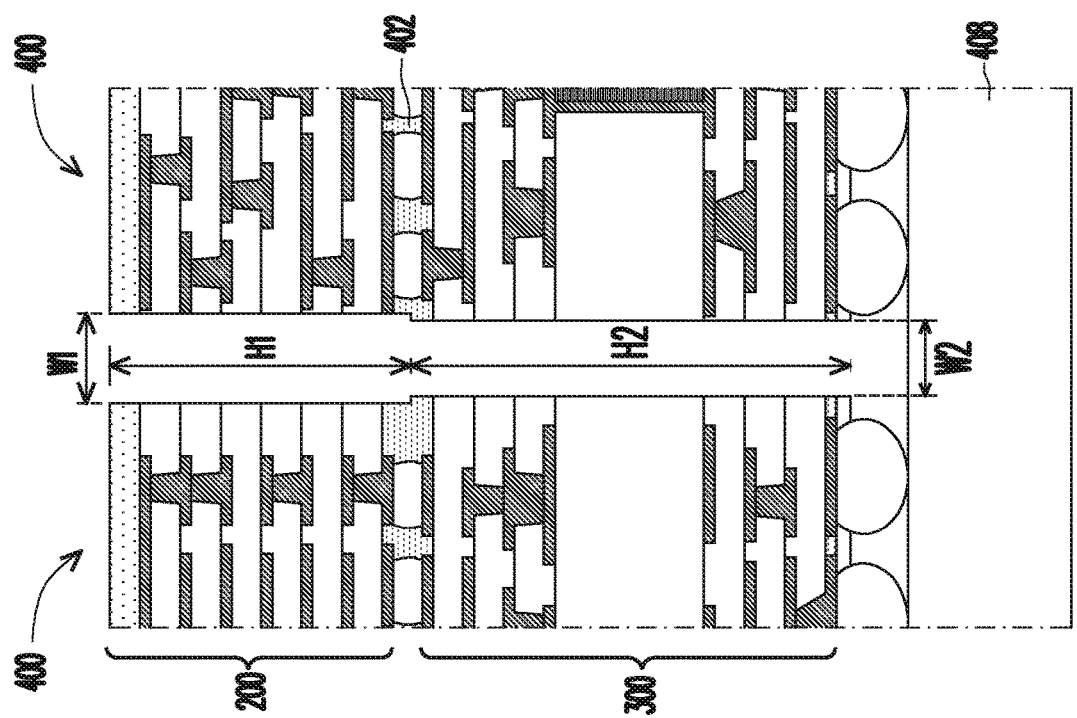

FIGS. 19A-C and FIGS. 20A-C show portions of adjacent packages 400 after a two-part singulation process has been performed, in accordance with some embodiments. In FIGS. 19A-C, the first trench has a depth H1 such that the bottom of the first trench is within the underfill 402. Thus, the packages 400 have stepped profiles in which a step is located below the bottom of the device structure 200 and above the interconnect structure 300. The step of a stepped profile may be located at any vertical position between the device structure 200 and the interconnect structure 300. In some embodiments, the lateral distance of a step is between about 0 μm and about 200 μm, which may be determined from the relative sizes and relative positions of the first trench (having width W1) and the second trench (having width W2). As shown in FIG. 19A, in some embodiments, after forming the second trench, portions of the underfill 402 may remain on the sidewalls of both adjacent interconnect structures 300. In some cases, the presence of underfill 402 remaining on an interconnect structure 300 can help protect the interconnect structure 300 from e.g., physical damage or the environment. In some cases, leaving underfill 402 remaining on an interconnect structure 300 can reduce the chance of delamination or warping. The remaining underfill 402 may have about the same thickness on each sidewall or may have different thicknesses. In some embodiments, the underfill 402 remaining on the sidewalls may have thicknesses between about 0 μm and about 200 μm. In some embodiments, a ratio of width W1 to width W2 may be between about 0.1:1 and about 10:1. As shown in FIG. 19B, in some embodiments, after forming the second trench, portions of the underfill 402 may remain on the sidewall of only one of the adjacent interconnect structures 300. In some embodiments, the underfill 402 remaining on the sidewall may have a thickness between about 0 μm and about 200 μm. In some embodiments, a ratio of width W1 to width W2 may be between about 0.1:1 and about 10:1. As shown in FIG. 19C, in some embodiments, after forming the second trench, the sidewalls of both of the adjacent interconnect structures 300 may be free of underfill 402. In some embodiments, a ratio of width W1 to width W2 may be between about 0.1:1 and about 10:1.

Figure 20A:
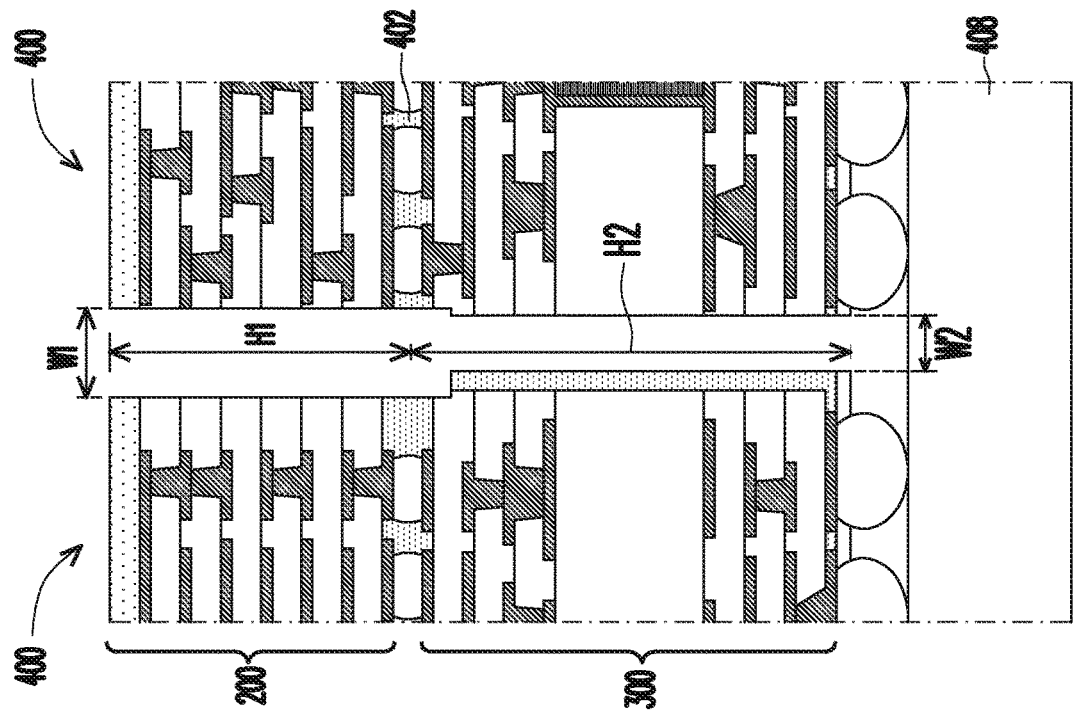
Figure 20B:
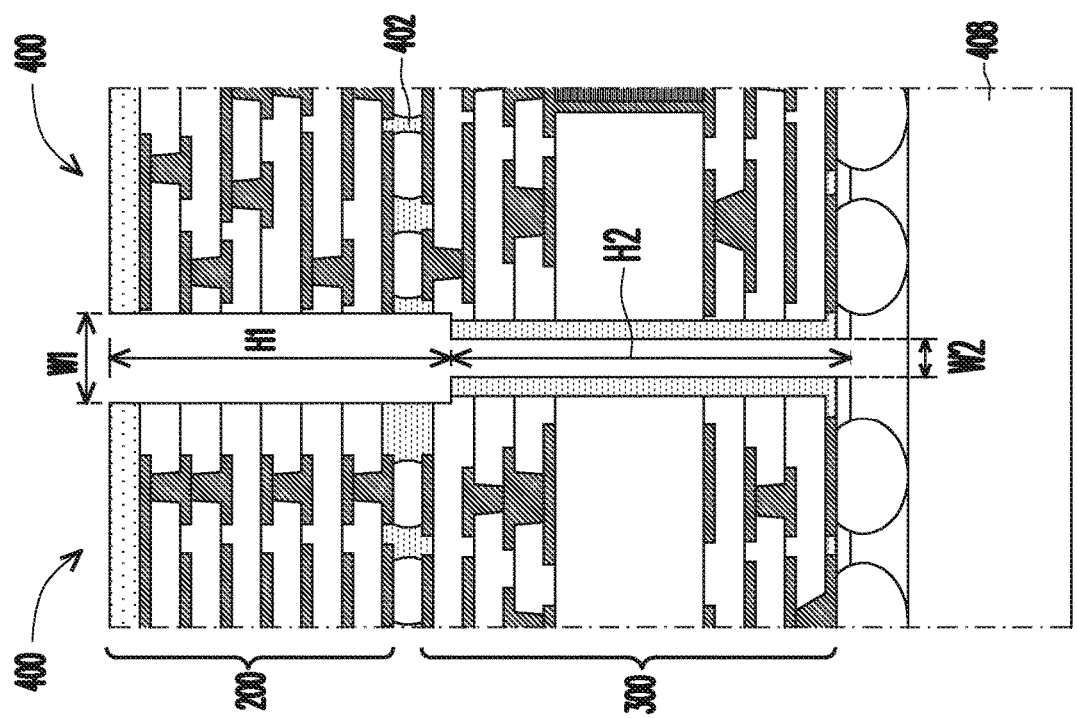
Figure 20C:
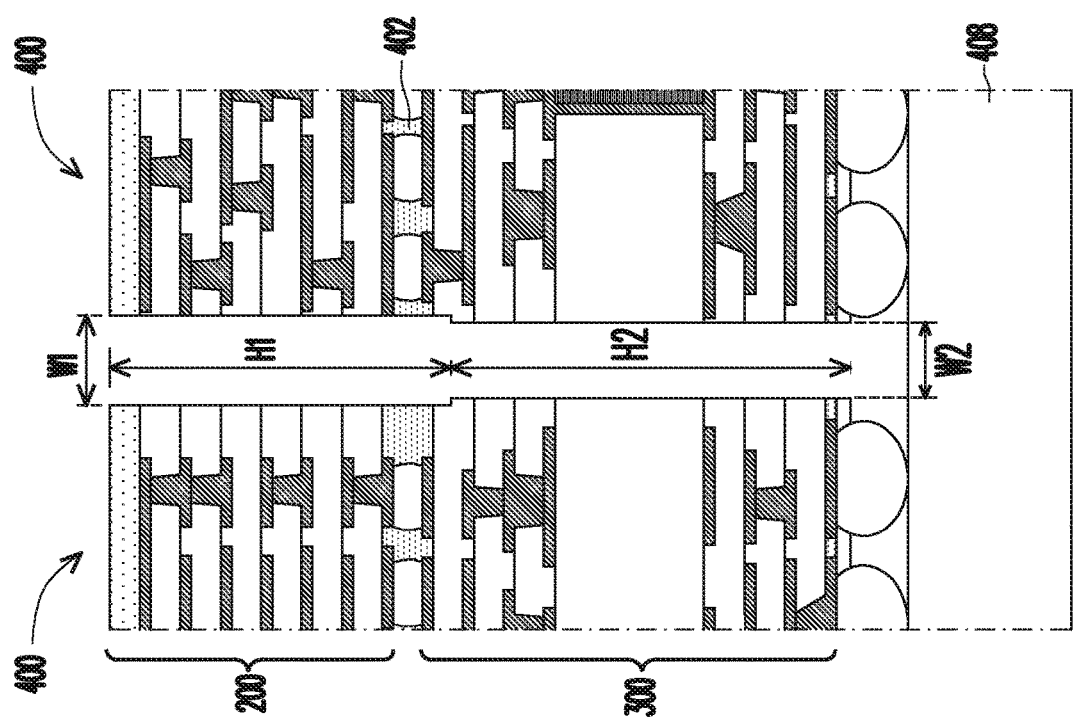

In FIGS. 20A-C, the first trench has a depth H1 such that the bottom of the first trench is below the top surface of the interconnect structure 300. Thus, the packages 400 have stepped profiles in which a step is located at least partially within the interconnect structure 300. The step of a stepped profile may be located at any vertical position within the interconnect structure 300, though in some embodiments the step is located within the topmost dielectric layer of the interconnect structure 300. In some embodiments, the first trench (having width W1) extends between 100 μm and about 2000 μm into the interconnect structure 300. In some embodiments, the lateral distance of a step is between about 0 μm and about 200 μm, which may be determined from the relative sizes and relative positions of the first trench (having width W1) and the second trench (having width W2). As shown in FIG. 20A, in some embodiments, after forming the second trench, portions of the underfill 402 may remain on the sidewalls of both adjacent interconnect structures 300. The remaining underfill 402 may have about the same thickness on each sidewall or may have different thicknesses. In some embodiments, the underfill 402 remaining on the sidewalls may have thicknesses between about 0 μm and about 200 μm. In some embodiments, a ratio of width W1 to width W2 may be between about 0.1:1 and about 10:1. As shown in FIG. 20B, in some embodiments, after forming the second trench, portions of the underfill 402 may remain on the sidewall of only one of the adjacent interconnect structures 300. In some embodiments, the underfill 402 remaining on the sidewall may have a thickness between about 0 μm and about 200 μm. In some embodiments, a ratio of width W1 to width W2 may be between about 0.1:1 and about 10:1. As shown in FIG. 20C, in some embodiments, after forming the second trench, the sidewalls of both of the adjacent interconnect structures 300 may be free of underfill 402. In some embodiments, a ratio of width W1 to width W2 may be between about 0.1:1 and about 10:1.

By utilizing the embodiments described herein, the performance of a device package may be improved, the cost of a device package may be decreased, and the reliability of a device package may be improved. Different features of embodiments described herein may be combined to achieve these and other benefits. In some cases, by forming more electrical routing of the device package in redistribution structures. By using established processes for forming electrical routing in redistribution structures (e.g., fan-out processes), the electrical routing of the device package may be formed with decreased cost, greater efficiency, and/or improved reliability. Redistribution structures as described herein may be more reliable and have improved electrical performance relative to interconnect structures formed from, e.g., build-up processes on a core substrate. In some cases, by forming redistribution structures as described, more of the manufacturing of a device package may be performed in a single process flow, which can reduce manufacturing cost and improve manufacturing efficiency. In some cases, more than one redistribution structure may be formed in a device package. In some cases, warping and thermal effects may be reduced by forming more of the electrical routing in a redistribution structure and less of the electrical routing in an interconnect structure. In some cases, the techniques described herein may be used to reduce the cost, improve the reliability, and improve the performance of device packages having larger sizes, such as device packages having dimensions greater than about 70 mm by 70 mm (though also applicable to device packages having other dimensions), system-in-package devices, or system-on-wafer devices. For example, the use of an interconnect structure as described can provide stability and rigidity to the device package.

In an embodiment, a method includes forming a device structure, forming the device structure including forming a first redistribution structure over and electrically connected to a semiconductor device, forming a molding material surrounding the first redistribution structure and the semiconductor device, forming a second redistribution structure over the molding material and the first redistribution structure, the second redistribution structure electrically connected to the first redistribution structure, attaching an interconnect structure to the second redistribution structure, the interconnect structure including a core substrate, the interconnect structure electrically connected to the second redistribution structure, forming an underfill material on sidewalls of the interconnect structure and between the second redistribution structure and the interconnect structure. In an embodiment, attaching the interconnect structure to the second redistribution structure includes forming multiple solder bumps on the second redistribution structure and placing the interconnect structure on the multiple solder bumps. In an embodiment, forming the second redistribution structure includes depositing a polymer layer over the semiconductor device, patterning openings in the polymer layer, forming a patterned mask over the polymer layer, depositing conductive material over the polymer layer, using the patterned mask. In an embodiment, a sidewall surface of the underfill material has a lateral step. In an embodiment, the first redistribution structure has a first lateral width that is less than a second lateral width of the second redistribution structure. In an embodiment, the second redistribution structure has a second lateral width that is greater than a third lateral width of the interconnect structure. In an embodiment, the method further includes removing the underfill material from a sidewall of the interconnect structure. In an embodiment, the core substrate includes an epoxy molding compound. In an embodiment, the method further includes forming the interconnect structure, wherein forming the interconnect structure includes forming first conductive traces over a first side of a core substrate, forming second conductive traces over a second side of the core substrate, and forming a multiple through vias extending through the core substrate, the through vias electrically connected to the first conductive traces and to the second conductive traces.

In an embodiment, a method includes placing multiple semiconductor devices on a carrier substrate, forming multiple first redistribution structures, wherein each first distribution structure is formed on one or more respective semiconductor devices, encapsulating the multiple semiconductor devices and the multiple first redistribution structures with an encapsulant, forming multiple second redistribution structures, wherein each second distribution structure is formed on a respective first redistribution structure, attaching multiple interconnect structures to the multiple second redistribution structures, wherein each interconnect structure is attached to a respective second redistribution structure, depositing an underfill material between adjacent interconnect structures, and performing a singulation process to form multiple device packages, wherein each device package includes a semiconductor device of the multiple semiconductor devices, a first redistribution structure of the multiple first redistribution structures, a second redistribution structure of the multiple second redistribution structures, and an interconnect structure of the plurality of interconnect structures. In an embodiment, performing the singulation process includes forming a first trench extending between adjacent second redistribution structures of the multiple second redistribution structures, the first trench having a first width, and forming a second trench within the first trench, the second trench having a second width that is less than the first width, the second trench extending between adjacent interconnect structures of the multiple interconnect structures. In an embodiment, after performing the singulation process, the multiple second redistribution structures each have a first lateral width and the multiple interconnect structures each have a second lateral width, wherein the first lateral width is between 50% and 150% of the second lateral width. In an embodiment, attaching multiple interconnect structures to the multiple second redistribution structures includes a thermocompressive process. In an embodiment, each of the second redistribution structures of the multiple second redistribution structures has a first lateral width and each of the interconnect structures of the plurality of interconnect structures has a second lateral width, wherein the first lateral width is less than the second lateral width. In an embodiment, after performing the singulation process, each interconnect structure has sidewalls planar with sidewalls of the second redistribution structure.

In an embodiment, a package includes a device structure including a first redistribution structure electrically connected to at least one semiconductor device, wherein the first redistribution structure and the at least one semiconductor device is surrounded by a molding material, a second redistribution structure extending over the first redistribution structure and the first molding material of the device structure, wherein the second redistribution structure is electrically connected to the first redistribution structure of the device structure, wherein the second redistribution structure includes first conductive traces and first dielectric layers, an interconnect structure electrically connected to the second redistribution structure, the interconnect structure including a routing structure formed over a substrate, wherein the routing structure includes a second conductive traces and second dielectric layers, wherein the material of the second dielectric layers is different from the material of the first dielectric layers, and an underfill material extending between the second redistribution structure and the interconnect structure. In an embodiment, the coefficient of thermal expansion (CTE) of the material of the second dielectric layers is greater than the CTE of the material of the first dielectric layers. In an embodiment, the material of the second dielectric layers includes Ajinomoto build-up film (ABF). In an embodiment, the underfill material extends over sidewalls of the interconnect structure. In an embodiment, the first multiple conductive traces have a smaller line width roughness (LWR) than the second multiple conductive traces.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device structure, forming the device structure comprising:
      forming a first redistribution structure over and electrically connected to a semiconductor device; and
      forming a molding material surrounding the first redistribution structure and the semiconductor device;
   forming a second redistribution structure over the molding material and the first redistribution structure, the second redistribution structure electrically connected to the first redistribution structure;
   attaching an interconnect structure to the second redistribution structure, the interconnect structure comprising a core substrate, the interconnect structure electrically connected to the second redistribution structure, wherein the redistribution structure has a lateral width that is greater than a lateral width of the interconnect structure; and
   forming an underfill material on sidewalls of the interconnect structure and between the second redistribution structure and the interconnect structure.

2. The method of claim 1, wherein attaching the interconnect structure to the second redistribution structure comprises:
   forming a plurality of solder bumps on the second redistribution structure; and
   placing the interconnect structure on the plurality of solder bumps.

3. The method of claim 1, wherein forming the second redistribution structure comprises:
   depositing a polymer layer over the semiconductor device;
   patterning openings in the polymer layer;
   forming a patterned mask over the polymer layer; and
   depositing conductive material over the polymer layer, using the patterned mask.

4. The method of claim 1, wherein a sidewall surface of the underfill material has a lateral step.

5. The method of claim 1, wherein the first redistribution structure has a lateral width that is less than a lateral width of the second redistribution structure.

6. The method of claim 1, wherein the core substrate comprises an epoxy molding compound.

7. The method of claim 1, further comprising forming the interconnect structure, wherein forming the interconnect structure comprises:
- forming a first plurality of conductive traces over a first side of a core substrate;
- forming a second plurality of conductive traces over a second side of the core substrate; and
- forming a plurality of through vias extending through the core substrate, the through vias electrically connected to the first plurality of conductive traces and to the second plurality of conductive traces.

8. A method, comprising:
- placing a plurality of semiconductor devices on a carrier substrate;
- forming a plurality of first redistribution structures, wherein each first redistribution structure is formed on one or more respective semiconductor devices;
- encapsulating the plurality of semiconductor devices and the plurality of first redistribution structures with an encapsulant;
- forming a plurality of second redistribution structures, wherein each second distribution structure is formed on a respective first redistribution structure;
- attaching a plurality of interconnect structures to the plurality of second redistribution structures, wherein each interconnect structure is attached to a respective second redistribution structure;
- depositing an underfill material between adjacent interconnect structures; and
- performing a singulation process to form a plurality of device packages, wherein each device package comprises a semiconductor device of the plurality of semiconductor devices, a first redistribution structure of the plurality of first redistribution structures, a second redistribution structure of the plurality of second redistribution structures, and an interconnect structure of the plurality of interconnect structures.

9. The method of claim 8, wherein performing the singulation process comprises:
- forming a first trench extending between adjacent second redistribution structures of the plurality of second redistribution structures, the first trench having a first width; and
- forming a second trench within the first trench, the second trench having a second width that is less than the first width, the second trench extending between adjacent interconnect structures of the plurality of interconnect structures.

10. The method of claim 8, wherein, after performing the singulation process, the plurality of second redistribution structures each have a first lateral width and the plurality of interconnect structures each have a second lateral width, wherein the first lateral width is between 50% and 150% of the second lateral width.

11. The method of claim 8, wherein attaching the plurality of interconnect structures to the plurality of second redistribution structures comprises a thermocompressive process.

12. The method of claim 8, wherein each of the second redistribution structures of the plurality of second redistribution structures has a first lateral width and each of the interconnect structures of the plurality of interconnect structures has a second lateral width, wherein the first lateral width is less than the second lateral width.

13. The method of claim 8, wherein, after performing the singulation process, each interconnect structure has sidewalls planar with sidewalls of the second redistribution structure.

14. A method comprising:
- attaching a plurality of semiconductor devices to a carrier substrate;
- encapsulating the plurality of semiconductor devices with a first molding material;
- forming a first redistribution structure over the plurality of semiconductor devices and the first molding material, wherein the first redistribution structure is electrically connected to the plurality of semiconductor devices;
- depositing a second molding material to encapsulate the plurality of semiconductor devices, the first redistribution structure, and the first molding material, wherein a surface of the second molding material and a surface of the first redistribution structure are coplanar;
- forming a second redistribution structure extending over the first redistribution structure and the second molding material, wherein the second redistribution structure is electrically connected to the first redistribution structure;
- connecting an interconnect structure to the second redistribution structure, the interconnect structure comprising a routing structure formed over a substrate, wherein the routing structure is formed of different materials than the second redistribution structure; and
- encapsulating the interconnect structure with a third molding material, wherein the third molding material extends between the second redistribution structure and the interconnect structure.

15. The method of claim 14 further comprising performing a singulation process on the second redistribution structure, wherein the third molding material remains on sidewalls of the interconnect structure after performing the singulation process.

16. The method of claim 14, wherein the routing structure comprises Ajinomoto build-up film (ABF).

17. The method of claim 14, wherein connecting an interconnect structure to the second redistribution structure comprises forming conductive connectors on the second redistribution structure, placing the interconnect structure on the conductive connectors, and performing a reflow process.

18. The method of claim 14, wherein conductive traces of the second redistribution structure have a smaller line width than conductive traces of the routing structure.

19. The method of claim 1, wherein a sidewall of the second redistribution structure is coplanar with a sidewall of the underfill material.

20. The method of claim 14, wherein the second redistribution structure is wider.

* * * * *